US008519347B2

(12) United States Patent
Kanatzidis et al.

(10) Patent No.: US 8,519,347 B2
(45) Date of Patent: Aug. 27, 2013

(54) METHODS AND COMPOSITIONS FOR THE DETECTION OF X-RAY AND GAMMA-RAY RADIATION

(75) Inventors: Mercouri G. Kanatzidis, Wilmette, IL (US); Ioannis Androulakis, Evanston, IL (US); Simon Johnsen, Hammel (DK); Sebastian C. Peter, Bangalore (IN)

(73) Assignee: Northwestern University, Evanston, IL (US)

( * ) Notice: Subject to any disclaimer, the term of this patent is extended or adjusted under 35 U.S.C. 154(b) by 6 days.

(21) Appl. No.: 13/205,965

(22) Filed: Aug. 9, 2011

(65) Prior Publication Data
US 2012/0153178 A1  Jun. 21, 2012

Related U.S. Application Data

(60) Provisional application No. 61/372,379, filed on Aug. 10, 2010.

(51) Int. Cl.
*G01T 1/24* (2006.01)

(52) U.S. Cl.
USPC ............ 250/370.09; 250/370.11; 250/370.12; 250/370.13; 250/361 R

(58) Field of Classification Search
USPC .................................................. 250/370.12
See application file for complete search history.

(56) References Cited

U.S. PATENT DOCUMENTS

| | | | | |
|---|---|---|---|---|
| 6,323,489 B1 * | 11/2001 | McClellan | ................ | 250/361 R |
| 6,585,913 B2 * | 7/2003 | Lyons et al. | ................ | 252/301.5 |
| 6,699,406 B2 * | 3/2004 | Riman et al. | ............. | 252/301.36 |
| 7,067,816 B2 * | 6/2006 | Dorenbos et al. | ......... | 250/370.11 |
| 7,141,794 B2 * | 11/2006 | Srivastava et al. | ......... | 250/361 R |
| 7,368,719 B2 * | 5/2008 | Srivastava et al. | ......... | 250/361 R |
| 7,576,329 B2 * | 8/2009 | Srivastava et al. | ....... | 250/370.11 |
| 7,608,201 B2 * | 10/2009 | Iltis | ........................ | 252/301.4 H |
| 8,021,636 B2 * | 9/2011 | Iltis | ............................... | 423/263 |
| 8,252,260 B2 * | 8/2012 | Iltis | ............................... | 423/263 |
| 2001/0006214 A1 | 7/2001 | Boerner et al. | | |
| 2001/0008271 A1 | 7/2001 | Ikeda et al. | | |
| 2003/0075706 A1 * | 4/2003 | Shiang et al. | .......... | 252/301.4 R |
| 2003/0193040 A1 * | 10/2003 | Venkataramani et al. | ....................... | 252/301.4 F |
| 2004/0159793 A1 | 8/2004 | Brabec et al. | | |
| 2005/0104001 A1 * | 5/2005 | Shah | ........................ | 250/363.03 |
| 2007/0284534 A1 * | 12/2007 | Srivastava et al. | ....... | 250/370.11 |
| 2008/0067391 A1 | 3/2008 | Shimizu et al. | | |
| 2009/0179155 A1 | 7/2009 | Weinberg | | |

OTHER PUBLICATIONS

Luke et al.,Pocket-size CdZnTe gamma-ray spectrometer, Nuclear Science Symposium Conference Record, IEEE, Nov. 2004.*

(Continued)

*Primary Examiner* — David Porta
*Assistant Examiner* — Djura Malevic
(74) *Attorney, Agent, or Firm* — Bell & Manning, LLC

(57) ABSTRACT

Compounds, methods and devices for detecting incident radiation, such as incident x-rays or gamma-rays, are provided. The detection of incident radiation can be accomplished by employing inorganic compounds that include elements with high atomic numbers, that have band gaps of at least about 1.5 eV, and that have an electrical resistivity of at least $10^6$ Ωcm as photoelectric materials in a radiation detector. The compounds include inorganic compounds comprising at least one element from periods five or six of the Periodic Table of the Elements.

26 Claims, 32 Drawing Sheets

(56) References Cited

OTHER PUBLICATIONS

Shaban, Measurements of Transport properties of TlGaSe2, Materials Chemistry and Physics 119, 2010.*

International Search Report and Written Opinion received in PCT/US2011/047088, Mar. 14, 2012.

Kanatzidis et al., Dimensional Reduction in II-VI Materials: $A_2Cd_3Q_4$ (A=K, Q=S, Se, Te; A=Rb, Q=S, Se), Novel Ternary Low-Dimensional Cadmium Chalcogenides Produced by Incorporation of $A_2Q$ in CdQ, Chem. Eur. J., vol. 2, No. 6, Jun. 1996, pp. 656-666.

Li et al., $Rb_2Hg_3Te_4$: A New Layered Compound Synthesized from Solvothermal Reactions, Inorg. Chem., vol. 36, No. 4, Feb. 12, 1997, pp. 684-687.

Babanly et al., Phase Equilibria and Thermodynamic Properties of the Hg-Tl-Te System, 1983, pp. 524-528.

Bugaris et al., Dicaesium hexamercury heptasulfide, Acta Crystallographica Section E64, Aug. 9, 2008.

Klintenberg et al., Potential scintillators identified by electronic structure calculations, Nuclear Instruments and Methods in Physics Research A, vol. 486, Apr. 12, 2002, pp. 298-302.

Ammlung et al., Conductivity and Raman Spectroscopy of New Indium(I) and Thallium(I) Ionic Conductors. $In_4CdI_6$, $In_2ZnI_4$ and $Tl_2ZnI_4$, and the Related Compound $Tl_4CdI_6$, Journal of Solid State Chemistry, vol. 21, No. 3, Jul. 1977, pp. 185-193.

Nagase et al., Electrical Conductivity and Thallium Spin-Lattice Relaxation Time Measurements of $Tl_4HgBr_6$ and $Tl_4HgI_6$, Bull. Chem. Soc. Jpn., vol. 63, No. 11, Nov. 1990, pp. 3329-3330.

English language Abstract: Hoyer et al., Z. Anorg. Allg. Chem., 587, 1990, pp. 23.

Poudeu et al., The intergrowth structure of $Ag_{1.2}Bi_{17.6}S_{23}Cl_8$ and its relation to the tubular structure of $Bi_{6+8}S_{638}$ and the pavonite homologue $Ag_{3x}Bi_{5-3x}S_{8-6x}Cl_{6x-1}$, Journal of Solid State Chemistry, vol. 179, Jul. 27, 2006, pp. 3636-3644.

Yamane et al., Mechanochemical synthesis and order-disorder phase transition in fluoride ion conductor $RbPbF_3$, Solid State Ionics, vol. 179, Jun. 11, 2008, pp. 605-610.

English language Abstract: Ibanez et al., Revue De Chimie Minerale, 23, 1986, pp. 281.

Kanatzidis, New directions in synthetic solid state chemistry: chalcophosphate salt fluxes for discovery of new multinary solids, Current Opinion in Solid State & Materials Science, vol. 2, No. 2, Apr. 1997, pp. 139-149.

Narducci et al., Syntheses, crystal structures, and band gaps of $Cs_2Cd_3Te_4$ and $Rb_2Cd_3Te_4$, Journal of Alloys and Compounds, vol. 306, Jun. 13, 2000, pp. 170-174.

Ibanez et al., Growth, Electrical and Photoelectrical Properties of $Tl_3SbS_3$ Single Crystal, Mat. Res. Bull., vol. 20, No. 8, Aug. 1985, pp. 921-927.

Owens, Semiconductor materials and radiation detection, J. Synchrotron Rad., vol. 13, Feb. 17, 2006, pp. 143-150.

Beun et al., Optical and Electrical Properties of Ternary Chalcogenides, Physica, 27, 1961, pp. 448-452.

Beun et al., Photoconductivity in Ternary Sulfides, Physica, 26, 1960, pp. 647-649.

Tagiev et al., Special Features of Charge Transport in $PbGa_2Se_4$ Crystals, Semiconductors, vol. 36, No. 3, 2002, pp. 273-275.

Löken et al., $Tl_2Au_4S_3$: x = 4/3 member of the series $A_{2-x}Au_xQ$. Preparation and an analysis of its gold-gold bonding, Chem. Commun., No. 15, Jan. 1, 1998, pp. 1603-1604.

* cited by examiner

METHODS AND COMPOSITIONS FOR THE DETECTION OF X-RAY AND GAMMA-RAY RADIATION

CROSS REFERENCE TO RELATED APPLICATIONS

This invention claims priority from U.S. provisional patent application Ser. No. 61/372,379, filed on Aug. 10, 2010, the entire disclosure of which is incorporated herein by reference.

STATEMENT OF GOVERNMENT RIGHTS

This invention was made with government support under grant number HDTRA1-09-C-0044 awarded by Department of Defense and under ARI MA CMMI-0938810 awarded by Department of Homeland Security and National Science Foundation. The government has certain rights in the invention.

BACKGROUND

X-ray and gamma-ray radiation detectors have applications in science (e.g., astro- and radio-physics, radiochemistry, medical research, etc.) and industry (e.g., medical and dental diagnostics). Furthermore, world events have created new applications for these detectors for national security purposes e.g., detection of radioisotopes. Although radiation detection may be implemented using many different techniques, the use of wide band gap semiconducting materials is the highly preferred choice since they yield far better energy resolution. Despite the advantages of semiconductor materials, only a handful of suitable compounds have been identified thus far, due to the strict requirements on the properties they should exhibit. Even for the benchmark compound used at room temperature, $Cd_{0.9}Zn_{0.1}Te$, inherently related growth and fabrication problems have limited its widespread use in radiation detectors.

Wide band gap semiconductors can be used in applications with the most demanding energy resolution requirements since they offer compact and highly versatile configurations with unsurpassed energy resolution. The latter property is based on considerations of: a) signal intensity (for a radiation interaction of a fixed energy, E, it can be shown that essentially all the generated electrons and holes can be used as information carriers); and b) statistical accuracy of the produced signal (the theoretical statistical variance of semiconductors, described by the so called Fano factor, can, under specific conditions, be zero, while experimentally it can approach zero).

The energy of incident ionizing radiation on a semiconductor is partitioned through various interactions, involving quantum energy processes, to electrons, plasmons, photons and atomic nuclei. At the end of this complex combination of interactions, known as the energy cascade, electron-hole pairs are generated in proportion to the energy of the absorbed incident photons. The charge carriers can, subsequently, be read out and provide information about the intensity and energy of the incident radiation. FIG. 1 shows a schematic diagram of a simple planar radiation detector. Upon absorption of electromagnetic radiation in a semiconducting material 100, electron-hole pairs are generated through the different scattering mechanisms described in detail below. The generated electron-hole pairs are read out by applying a large electric field, E, across the semiconducting material using a pair of electrodes (i.e., an anode and a cathode) in electrical communication with the semiconducting material. In order to have an efficient read-out it is imperative that the generated holes and electrons reach the respective electrodes. Hence, the material must allow the charge carriers to diffuse to the electrodes without being scattered (i.e., the mobility as well as the lifetime of carriers is desirably as high as possible). Low noise on the read-out requires low leakage currents. This implies a band gap that is desirably larger than 1.5 eV in order to operate at room temperature so effects of thermally excited carriers are minimized. One of the measures of quality for a semiconducting material used in this respect is the electrical resistivity which is desirably in the region of several $G\Omega$ cm.

The extent to which the semiconducting material absorbs radiation depends on the atomic numbers, Z, of its constituent elements. In the region below about 200 keV the absorption is mainly due to the photoelectric effect which scales with $Z^n$, where n typically is between 4 to 5. Compton scattering dominates until the MeV regime is reached, after which electron-positron pair (or their interation products) production becomes the principal scattering mechanism. The Compton scattering cross section scales linearly with Z whereas the cross section for pair production scales with Z squared. Hence efficient detector materials should contain elements with high Z values.

The benchmark material is $Cd_{0.9}Zn_{0.1}Te$ (CZT), which is used in commercial as well as scientific devices operating at room temperature. Despite its relative simplicity, several problems are associated with this compound. For commercial purposes the material is synthesized using the high pressure Bridgman method due to the volatility of the elements at the melting point of the phase. This is a costly and complicated setup and growth times are 3-4 weeks for a single crystal of the desired quality per grown boule. The reason being that synthesized CZT contains a significant amount of macro defects such as grains, cracks and Te precipitates. Since Te is a narrow band gap semiconductor these precipitates increases leakage currents and interfere with charge transport. These macro defects significantly reduce the parts of the boule which are detector grade. Furthermore the material is a solid solution between ZnTe and CdTe, hence there is inherently a decreasing Zn content along the growth direction. This further reduces the detector grade part of the boule. As a result, less than 10% of a synthesized boule can be used to fabricate detectors. Another problem inherent to CZT is the low mobility of the holes in the compound. For this reason, detectors with electrodes designed to detect only electrons are generally used. This reduces the sensitivity compared to detectors designed to detect both carrier types.

SUMMARY

One aspect of the present invention provides methods for detecting incident radiation. In some embodiments the methods comprise exposing a material to incident radiation, whereby the material absorbs incident radiation and electron-hole pairs are generated in the material, and detecting the generated electron-hole pairs to measure at least one of the energy or intensity of the absorbed incident radiation.

The material comprises an inorganic compound comprising at least one element with a high atomic number (e.g., an atomic number of at least 34). In some embodiments the compounds comprise at least one element from period five or period six of the Periodic Table of the Elements. This includes compounds (e.g., ternary compounds) that include at least two elements from period five and/or period six of the Periodic Table of the Elements and further includes compounds that include at least three elements from period five and/or period six of the Periodic Table of the Elements. This includes compounds that include at least one or at least two elements selected from gold, mercury, thallium, lead or bismuth.

In some embodiments, the compounds are chalcogenides (compounds that include at least one of sulfur, selenium or tellurium). In some embodiments the chalcogenide compounds further include at least one element from period five or period six of the Periodic Table (in addition to the tellurium for those chalcogenides that include tellurium). In some embodiments the compounds include only elements selected from period five of the Periodic Table of the Elements, period six of the Periodic Table of the Elements, sulfur and selenium. In some embodiments, the inorganic compounds comprise at least three elements, wherein at least one of the three elements is an element from period five or period six of the Periodic Table of the Elements and another of the three elements is selected from S, Se, Te, Cl, F, I and Br. In some such embodiments, the first of the three elements is from period five or period six of the Periodic Table of the Elements, the second of the three elements is from period four, period five or period six of the Periodic Table of the Elements, and the third of the three elements is selected from S, Se, Te, Cl, F, I and Br.

In some embodiments the incident radiation comprises x-ray radiation. In some embodiments the incident radiation comprises gamma radiation.

The compounds desirably have a band gap of at least 1.5 eV. This includes compounds having a band gap of at least 2 eV. For example, in some embodiments the compounds have a band gap of about 1.6 eV to about 2.6 eV.

The compounds desirably have an electrical resistivity of at least $10^6$ Ωcm. This includes compounds having an electrical resistivity of at least $10^7$ Ωcm, further includes compounds having an electrical resistivity of at least $10^8$ Ωcm, still further includes compounds having an electrical resistivity of at least $10^9$ Ωcm, still further includes compounds having an electrical resistivity of at least $10^{10}$ Ωcm, and still further includes compounds having an electrical resistivity of at least $10^{11}$ Ωcm.

Another aspect of the invention provides devices for the detection of incident radiation. In some embodiments the devices comprise a material comprising an inorganic compound, of the type described above, comprising at least one element with a high atomic number (e.g., an atomic number of at least 34), wherein the material is capable of absorbing incident radiation and generating electron-hole pairs, a first electrode in electrical communication with the material, and a second electrode in electrical communication with the material. In such devices the first and second electrodes are configured to apply an electric field across the material. The devices can further comprise one or more additional electronic components configured to measure a signal generated by the electron-hole pairs upon exposure to incident radiation.

DETAILED DESCRIPTION

Compounds, methods and devices for detecting the incident radiation, such as incident x-rays or gamma-rays, are provided. The detection of incident radiation can be accomplished by employing inorganic compounds that include elements with high atomic numbers, that have band gaps of at least about 1.5 eV, and that have an electrical resistivity of at least $10^6$ Ωcm as photoelectric materials in a radiation detector. The compounds include an inorganic compound comprising at least three elements, wherein at least one of the three elements is an element from period five or period six of the Periodic Table of the Elements and another of the three elements is selected from S, Se, Te, Cl, F, I and Br.

The present invention focuses on materials with high Z elements such as gold, mercury, thallium, lead and bismuth. Since the absorption scales as $Z^a$, where the power a depends on the energy of the incident radiation, it is advantageous to have high Z elements in the material. This can be illustrated using the examples of GaAs and InP. Both have the same average Z (In and P have Z=49 and 15 respectively while Ga and As have 31 and 33), but the absorption in InP is 2-3 times higher in the hard x-ray region.

Figure 1:
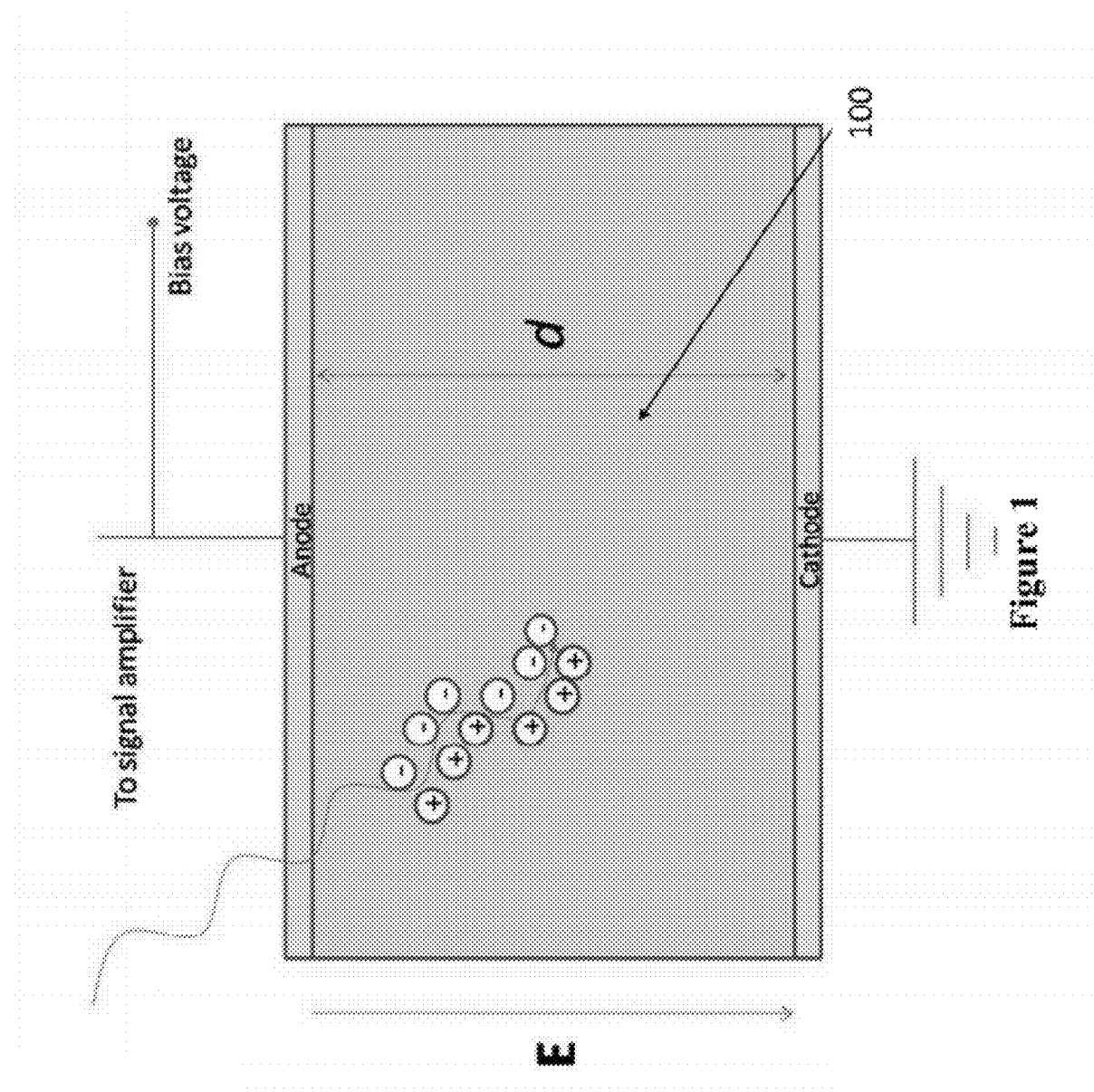
FIG. 1: Schematic of a simple planar detector system where the signal processing electronics have been omitted.
Figure 2:
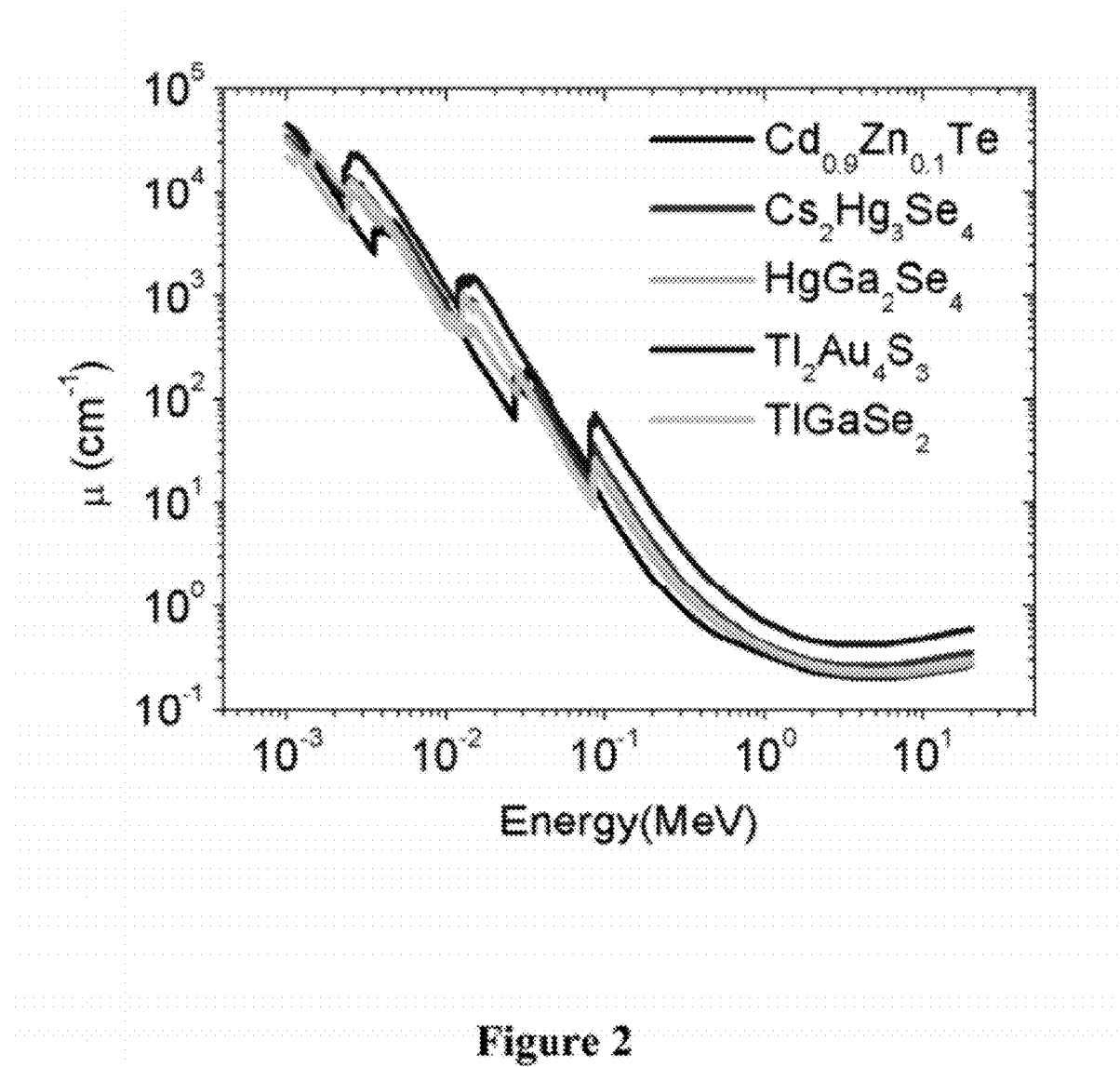
FIG. 2: Calculated absorption of several of the present compounds. CZT is added for comparison.

Since absorption is higher in materials with high Z, the requirement for the thickness (d in FIG. 1) of the material in actual devices can be relaxed. Thus, the generated charge carriers do not have to diffuse as long to reach the read-out electrodes. In turn this means that requirements for μτ can be relaxed. In FIG. 2 the calculated absorption values for several of the materials of the present invention are shown, along with the absorption value of CZT for comparison. This is using the absorption calculated using tables of x-ray mass attenuation coefficients calculated by the National Institute of Standards and Technology. It is seen that the proposed materials are as good as, or outperform, CZT across the entire energy range (note the logarithmic scale). Notably in the high energy region the proposed materials show superior absorption.

The present invention involves new materials for detection of ionizing radiation. These are wide band gap semiconductors containing one or more elements from periods five and/or six of the periodic table of the elements. This includes, but is not limited to, the following compounds as well as solid solutions thereof (where 'm' and 'n' are numbers representing the relative number of each type of atoms in the compounds):
$AB_2Q_4$ compounds with A=Cd, Hg or Pb; B=Al, Ga, or In; and Q=S, Se, or Te;
$TlBQ_2$ compounds with B=Al, Ga, or In; and Q=S, Se, or Te;
$(A_2Q)_m(AX)_n$ with A=Na, K, Rb, Cs or Tl; Q=S, Se, or Te; and X=F, Cl, Br or I;
$(AX)_m(BX_2)_n$ with A=Na, K, Rb, Cs or Tl; B=Cu, Zn, Cd, or Hg; and X=F, Cl, Br or I;
$(Pn_2Q_3)_m(PnX_3)_n$ with Pn=N, P, As, Sb or Bi; Q=S, Se, or Te; and X=F, Cl, Br or I;
$(A_2Q)_m(Au_2Q)_n$ with A=Na, K, Rb, Cs or Tl; and Q=S, Se, or Te;
$(A_2Q)_m(BQ)_n$ with A=Na, K, Rb, Cs or Tl; B=Cd or Hg; and Q=S, Se or Te; $(Tl_2S)_m(SnS_2)_n$; and
$(A_2Q)_m(Pn_2Q_3)_n$ with A=Na, K, Rb, Cs or Tl; Pn=P, As, Sb, or Bi; and Q=S, Se, or Te.

In the latter three series, above, the band gap can be engineered to the desired value by controlling the ratio of m and n; e.g. HgSe is a zero band gap material but with increasing $Cs_2Se$ content the band gap markedly increases: HgSe (0 eV)<$Cs_2Hg_6Se_7$ (1.0 eV)<$Cs_2Hg_3Se_4$ (2.6 eV)<$Cs_2HgSe_2$ (3.0 eV)<$Cs_6HgSe_4$ (>4 eV). Band gap engineering is also possible in the former two series.

The abovementioned systems have anionic extended frameworks with cations in cavities, between layers, as counterions to chains or molecular entities. Materials with cationic extended frameworks (e.g., $[Hg_3Te_2]^{2+}$, $[Hg_4Sb_2]^{2+}$) can act as x- and gamma-ray detectors. These comprise wide band gap semiconductors with $E_g$ ranging from 1.9 to 2.6 eV. For example, the band gaps of $[Hg_3Te_2][HfCl_6]$ and $[Hg_4As_2][HfCl_6]$ are approximately 2.6 and 1.9 eV, respectively, consistent with the red color of these compounds. Other examples of compounds that can be used in the present methods include:
$[Hg_6As_4][XCl_6]$ with X=Cd or Hg;
$[Hg_6As_4][XCl_6]Hg_{0.5}$ with X=Cd or Hg;
$[Hg_3Te_2][MX_6]$ with M=Zr or Hf; and X=Cl or Br;
$[Hg_6Pn_4][MX_6]X$ with Pn=N, P, As, Sb, or Bi; M=an element from Groups 4, 5, or 6 of the Periodic Table of the Elements; and X=F, Cl, Br, or I;
$[Hg_3T_2][TlX_3]$ with T=P, As, or Sb; and X=F, Cl, Br, I;
$[Hg_2As]_2[CdI_4]$;
$Bi_2O_2X$ with X=S, Se, or Te;
$Hg_3Te_2X_2$ with X=Cl, Br, or I;
$Hg_4T_2I_3$ with T=As or Sb;
$Hg_4P_2I_3$;
$[Hg_2Y]_2[MX_4]$ with Y=N, P, As, Sb, or Bi; M=an element from Group 13 of the Periodic Table of the Elements; and X=F, Cl, Br, or I;
$[Hg_2Y]_2[X]$ with Y=N, P, As, Sb, or Bi; X=a single charged anion, e.g. $(NO_3)^-$, F, Cl, Br, or I; and
$[Hg_2Y]_2[X]0.5$ with Y=N, P, As, Sb, or Bi; X=a double charged anion, e.g. $(SO_4)^{2-}$, $(SeO_4)^2$, $(MoO_4)^{2-}$, $(WO_4)^{2-}$.

Figure 3:
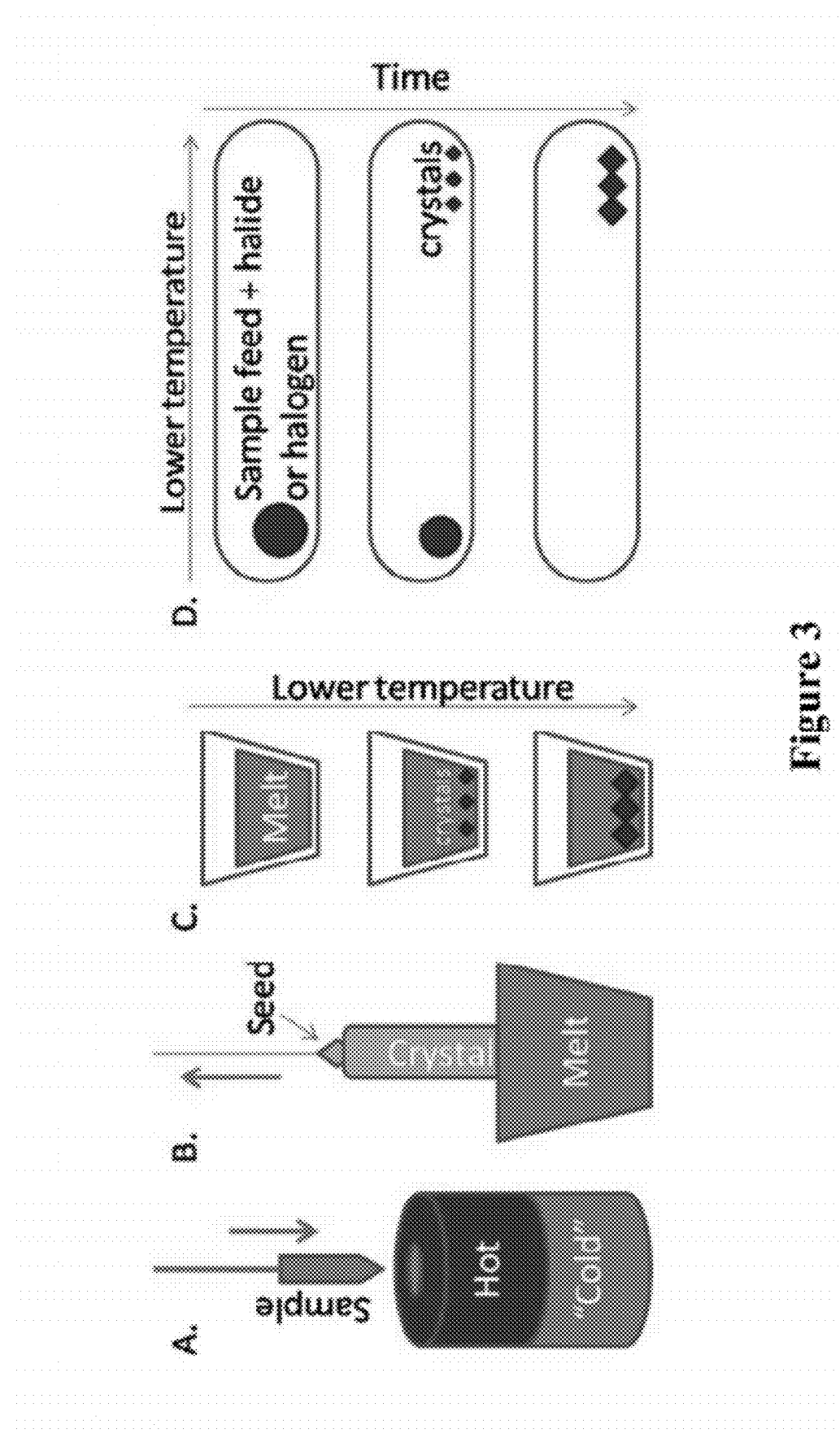
FIG. 3: Methods for large single crystal growth. Figure A. shows the Bridgman method, B. the Czochralski method, C. the flux method and D. the vapor transport method.
Figure 4:
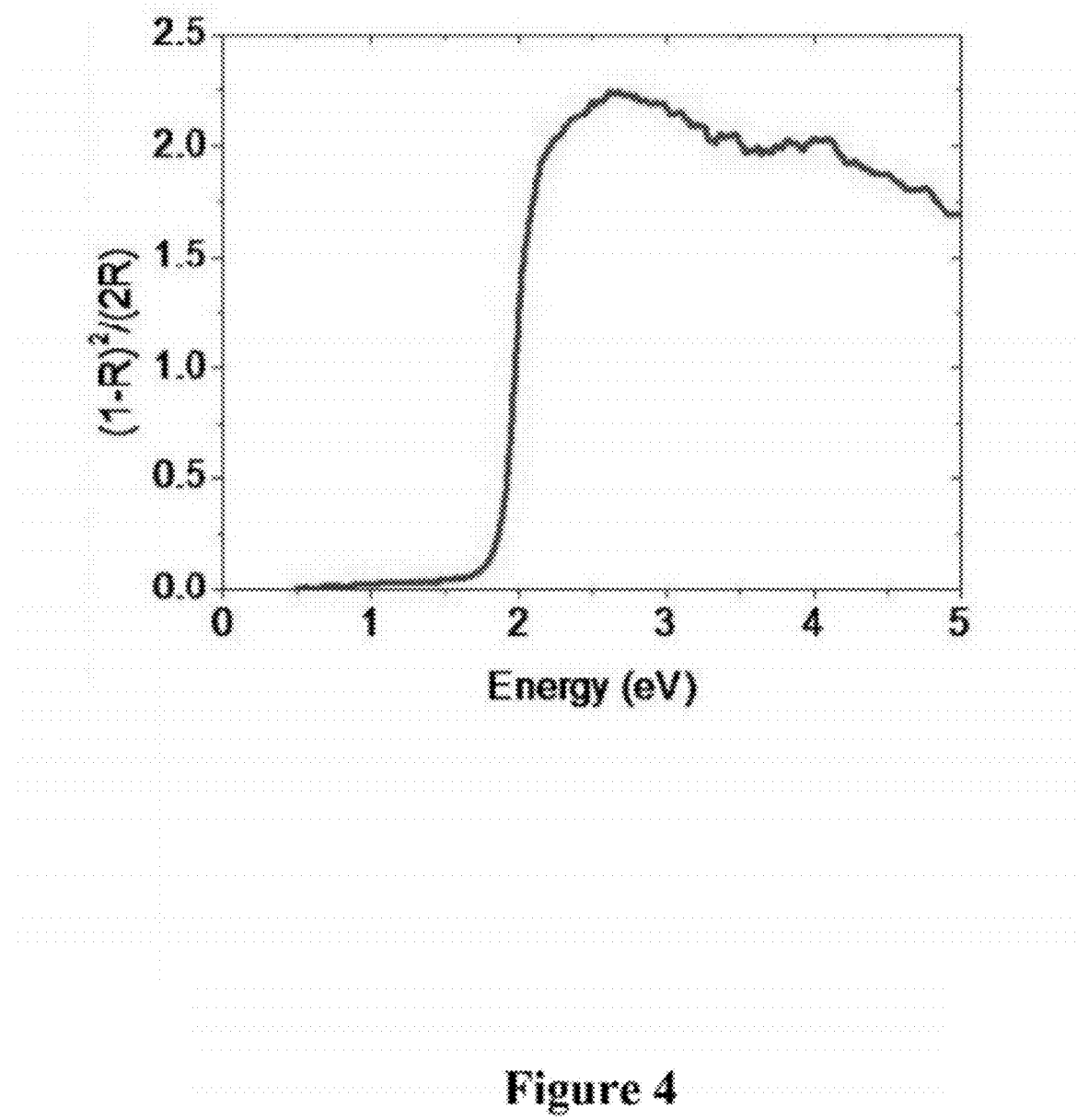
FIG. 4: Diffuse reflectance measurement on powdered $HgGa_2Se_4$ crystals.

Many of these cationic framework materials are congruently melting which allows for the growth of large crystals. When melting is incongruent, crystals can be grown using molten salt techniques, such as those described in M. G. Kanatzidis, Current Opinion in Solid State & Materials Science 2, 139 (1997). In FIG. 3 some of the crystal growth methods applied are shown in schematic form.

Certain embodiments of the compounds for use in radiation detection are illustrated in the following examples.

EXAMPLES

The following examples illustrate the synthesis and characterization of some materials that can be used as radiation detectors in accordance with the present methods.

Example 1

$AB_2Q_4$ Compounds with A=Cd, Hg or Pb; B=Al, Ga, or In Q=S, Se, or Te

Here, $HgGa_2Se_4$ serves as an example. Due to the high vapor pressure of the elements and their binaries at the melting point of this phase, this system is not suited for Bridgman growth. Large crystals can, however, be grown using chemical vapor transport. Pre-synthesized HgSe and $Ga_2Se_3$ in stoichiometric ratio were sealed in an evacuated quartz ampoule with 9 mg/cm³ of $HgI_2$. The ampoule was placed in the middle of a dual-zone furnace with one side at 700° C., the other at 750° C. Material was slowly transported from the hot end of the ampoule to the cold end, where it crystallized as nicely faceted crystals.

Figure 5:
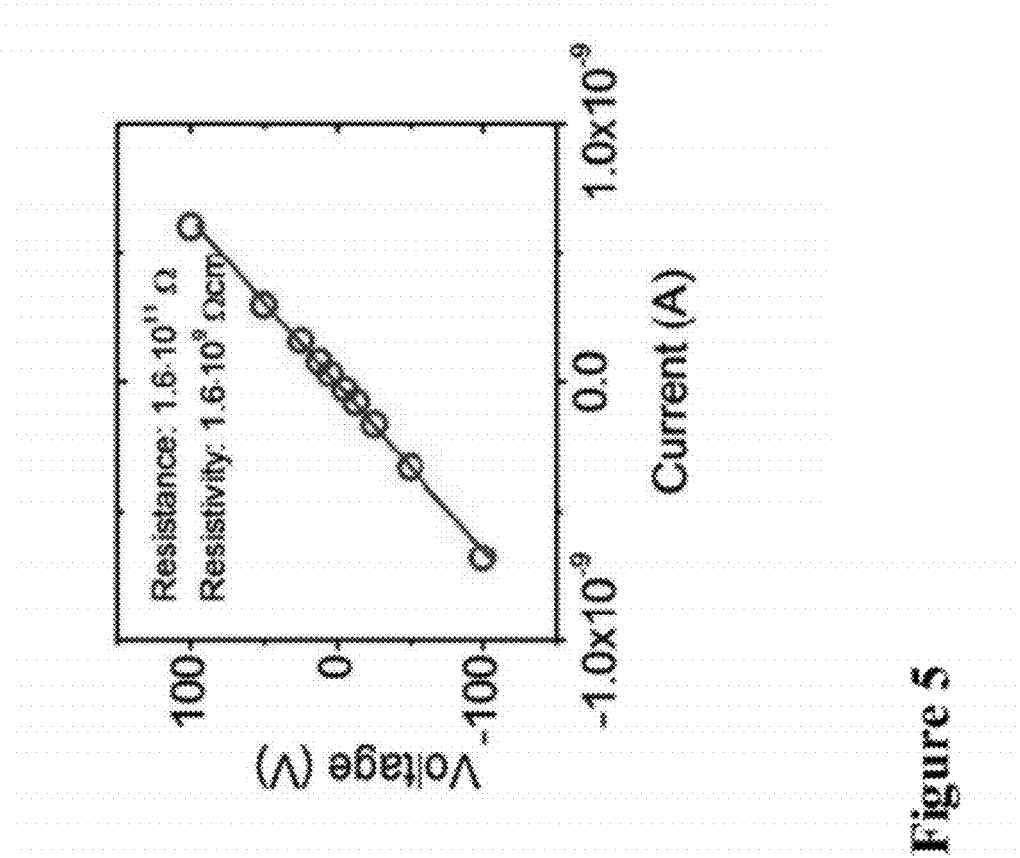
FIG. 5: (Left) Crystal structure of $HgGa_2Se_4$ with coordination environments of Hg and Ga to the right. (Right) Resistivity measurement on a $HgGa_2Se_4$ crystal.
Figure 5:
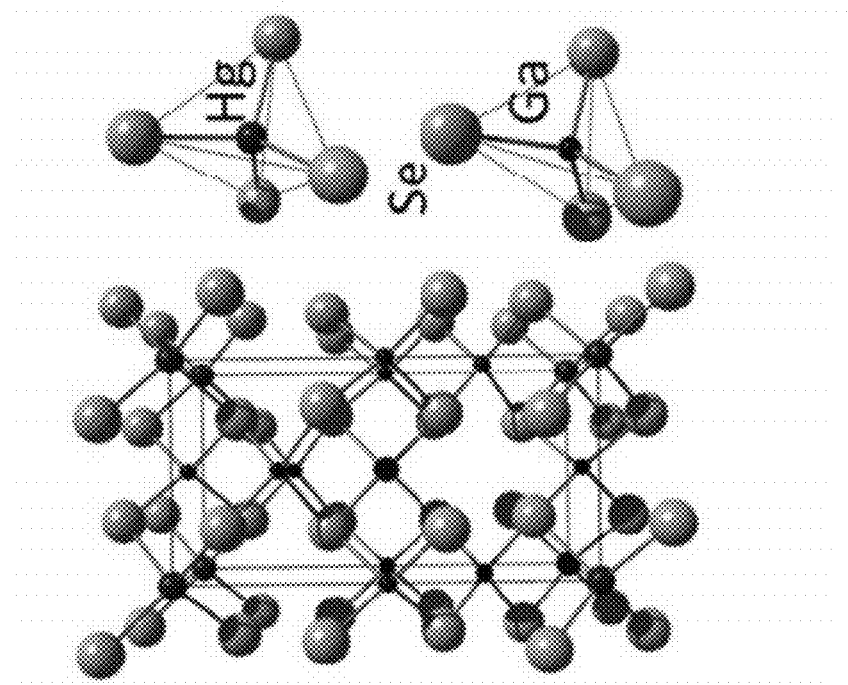
Figure 6:
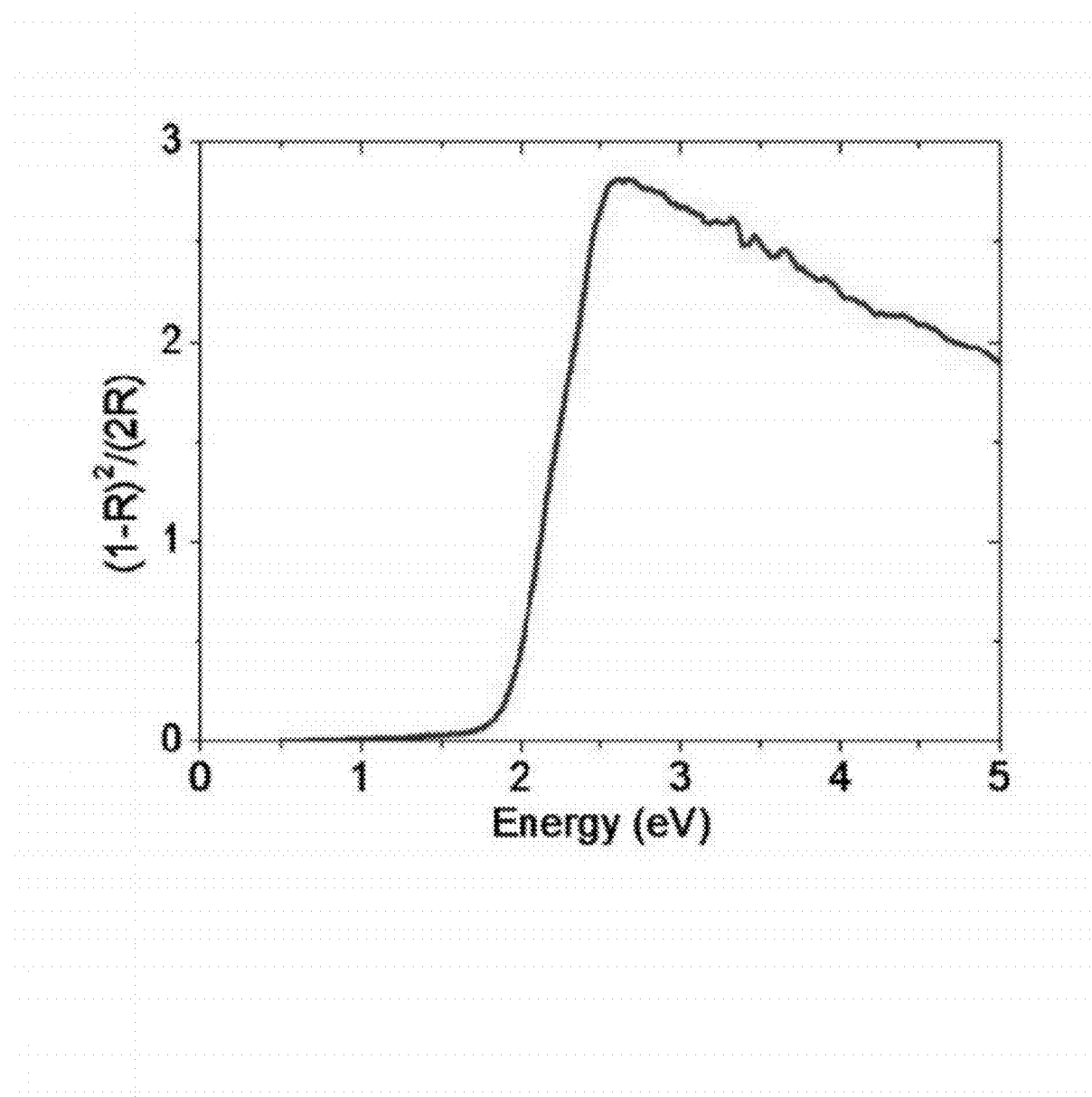
FIG. 6: Diffuse reflectance measurement on $PbGa_2Se_4$ powder.

$HgGa_2Se_4$ crystallizes in the defect chalcopyrite structure shown in FIG. 5 (right panel), with a,b=5.693(1) Å and c=10.286(4) Å. The measured resistivity for $HgGa_2Se_4$ is ~$10^9$ Ωcm (FIG. 5; left panel).

Example 2

Hg—Ga—S Compounds

Figure 7A:
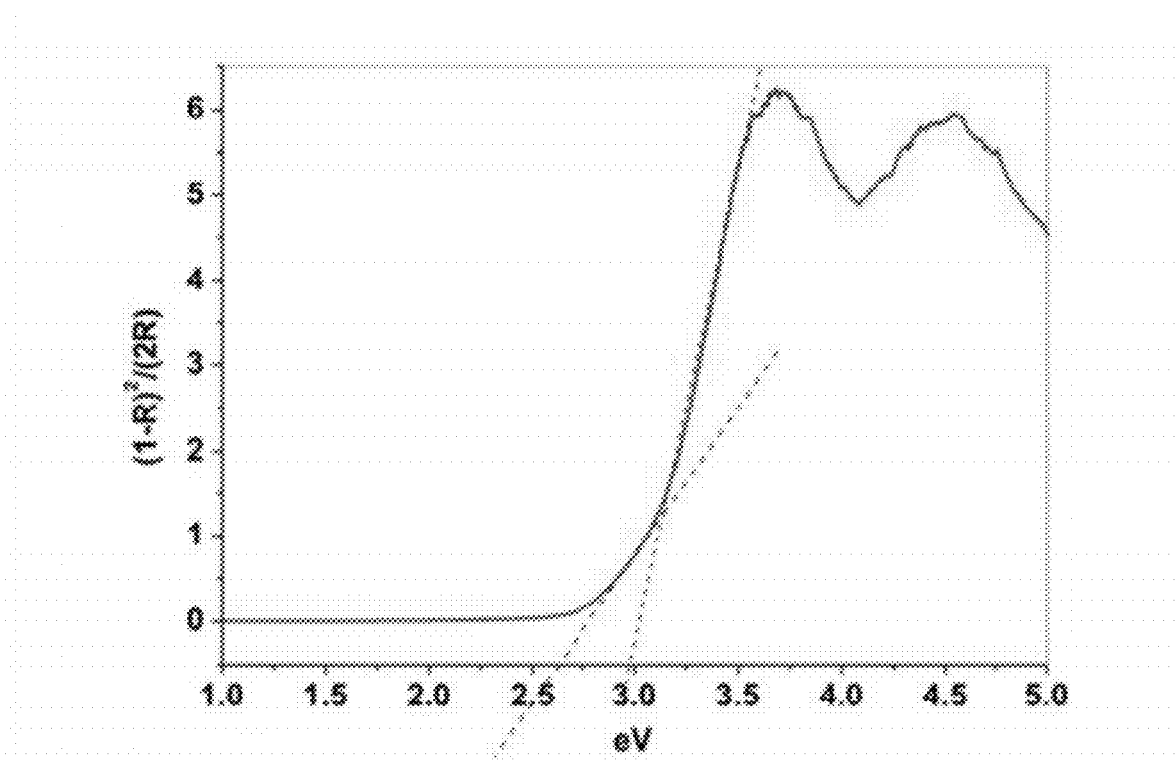
FIG. 7a-7c: Diffuse reflectance measurement on $Hg_xGa_yS_z$.
Figure 7B:
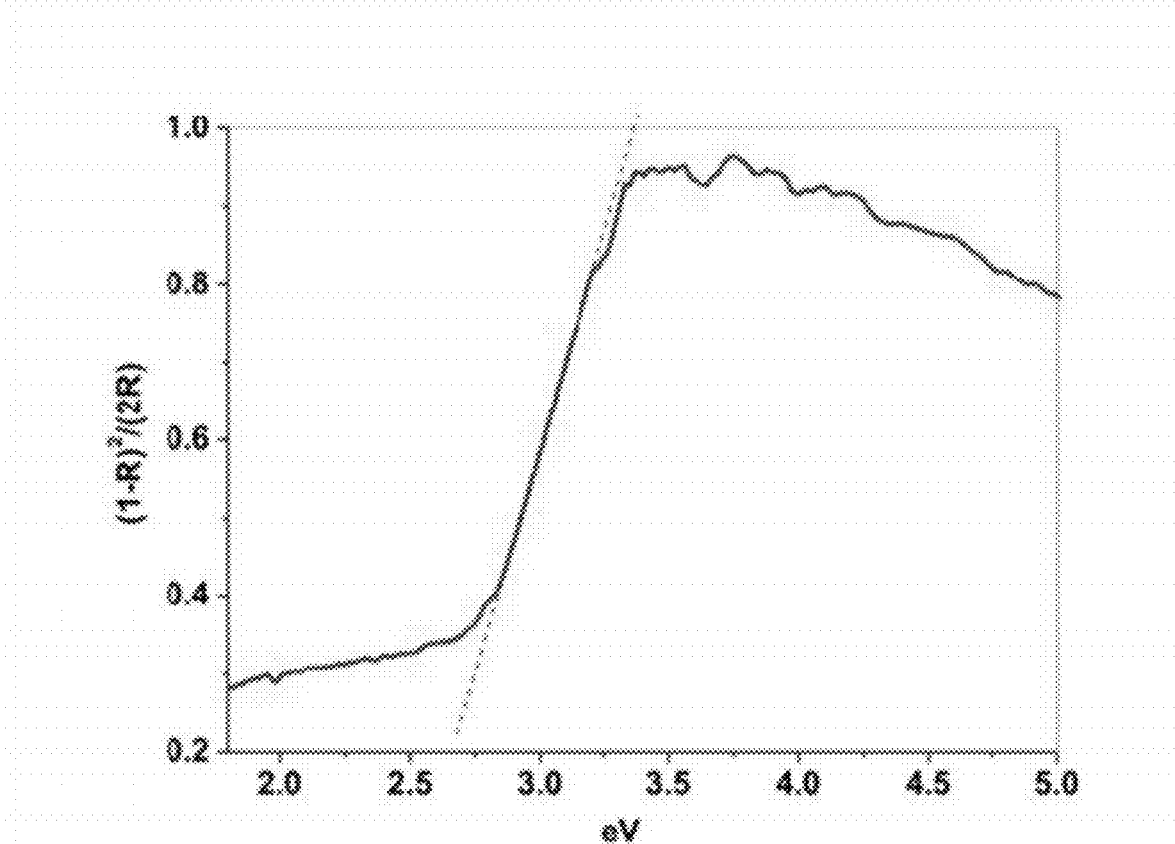
Figure 7C:
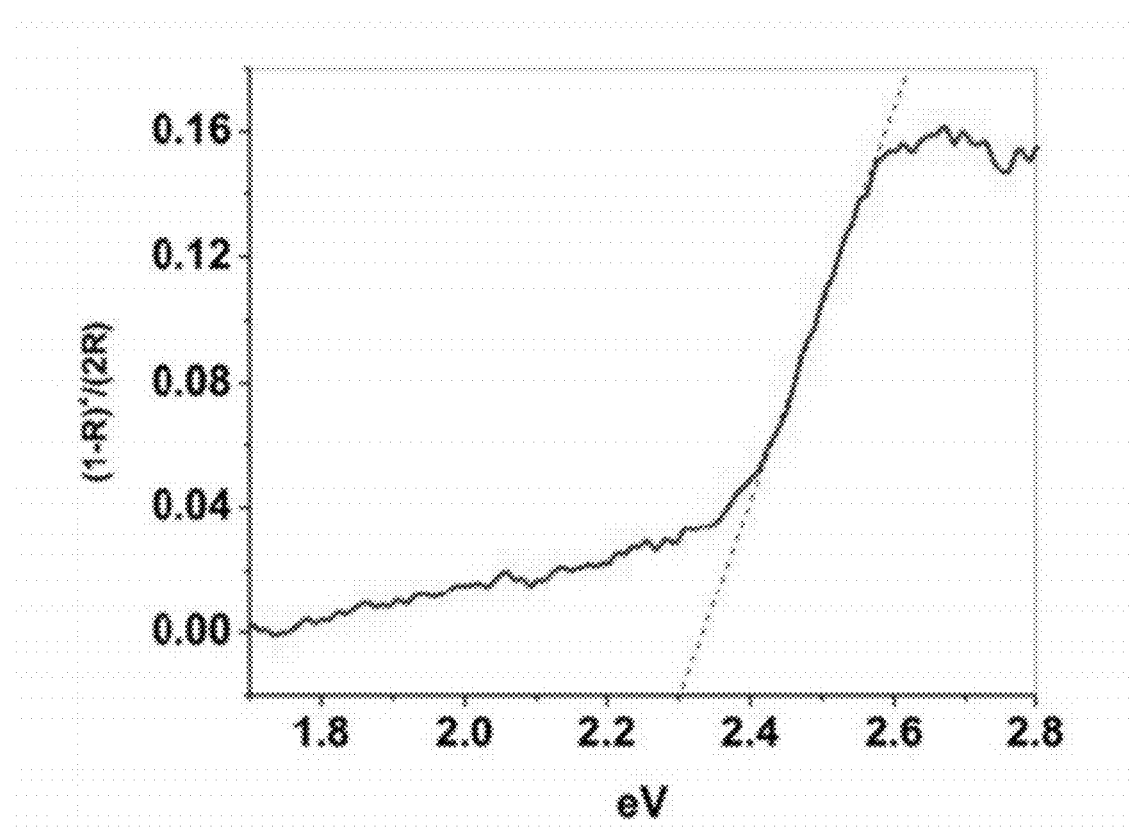

Due to the high vapor pressure of the elements and their binaries at the melting point of this phase, this system is not suited for Bridgman growth. Single crystals of these compounds up to several mm in size were grown from the vapor transport phase by means of a chemical transport reaction. Pre-synthesized HgS and $Ga_2S_3$ in a stoichiometric ratio were sealed in an evacuated quartz ampoule and some iodine, corresponding to a concentration of 5 mg I/cc, were used as the starting materials for the synthesis of $HgGa_2S_4$ (which appeared as yellow plates). The ampoule was placed in the middle of a dual-zone furnace with one side at 700° C., the other at 750° C. Material was slowly transported from the hot end of the ampoule to the cold end, where it was crystallized as nicely faceted crystals. When $HgI_2$ was used as the transport agent instead of $I_2$, $Hg_xGa_{2-x}S_3$ (yellow plates) and $Hg_{1+x}Ga_{2-x}S_4$ (which appeared as red crystals) compounds were formed. FIG. 7 shows the measured band gaps for the crystals.

Example 3

$TlBQ_2$ Compounds with B=Al, Ga, or In and Q=S, Se, or Te $TlGaSe_2$ was synthesized using the Bridgman technique. TlSe and elemental Ga and Se were sealed in a stoichiometric ratio in an evacuated quartz tube. Using the temperature gradient in a single-zone furnace with a core temperature of 900° C. the tube was lowered through the furnace at 8 mmh$^{-1}$. From the resulting boule, single crystals can be isolated. Measurements show a resistivity of ~$10^{10}$ Ωcm in these samples.

Figure 8:
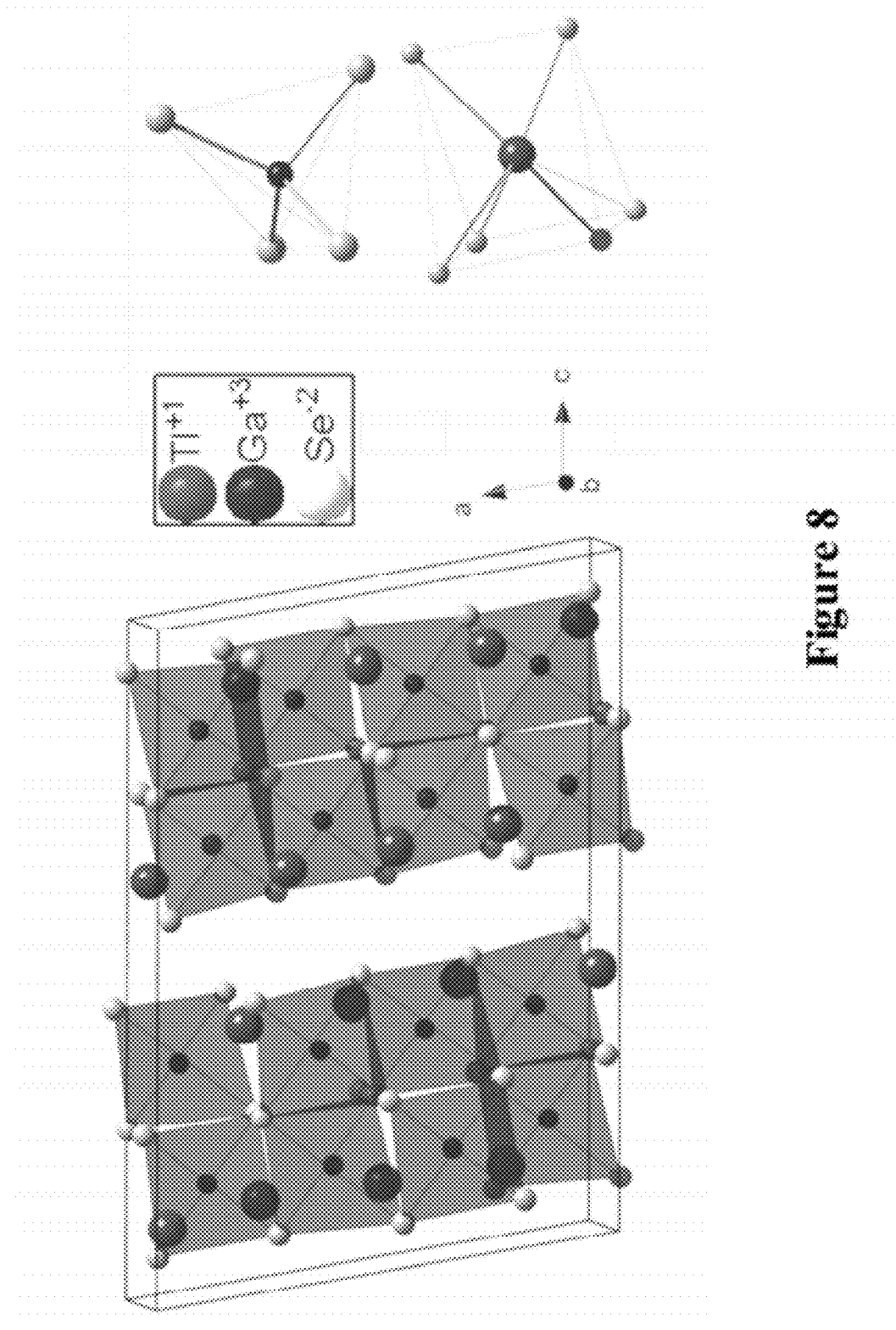
FIG. 8: Layered structure of $TlGaSe_2$ shown with the ac plane in the plane of the paper. Right hand side shows coordinations of Se atoms around Ga and Tl.
Figure 9:
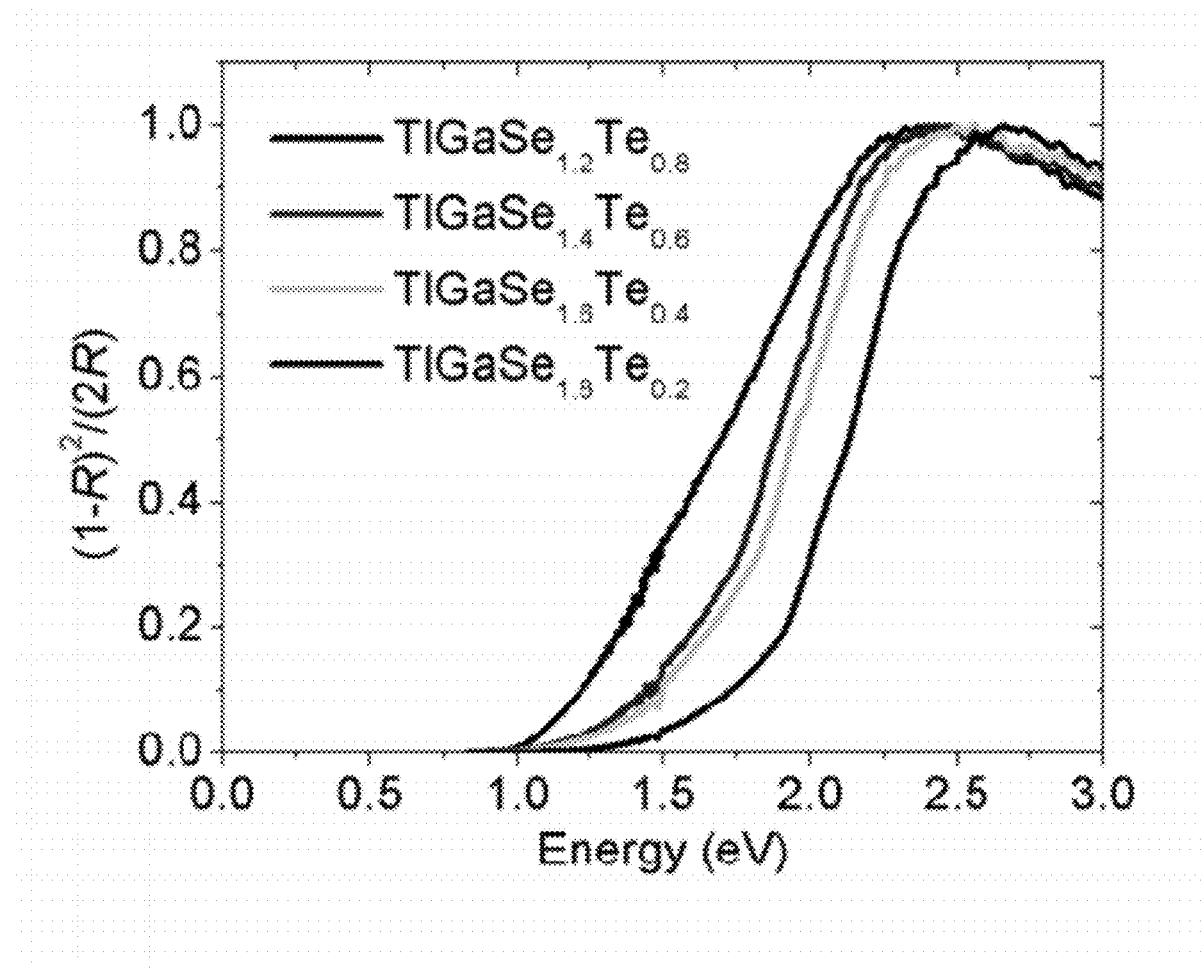
FIG. 9: Change in band gap of $TlGaSe_{2-x}Te_x$ with changing x as observed by diffuse reflectance.
Figure 10:
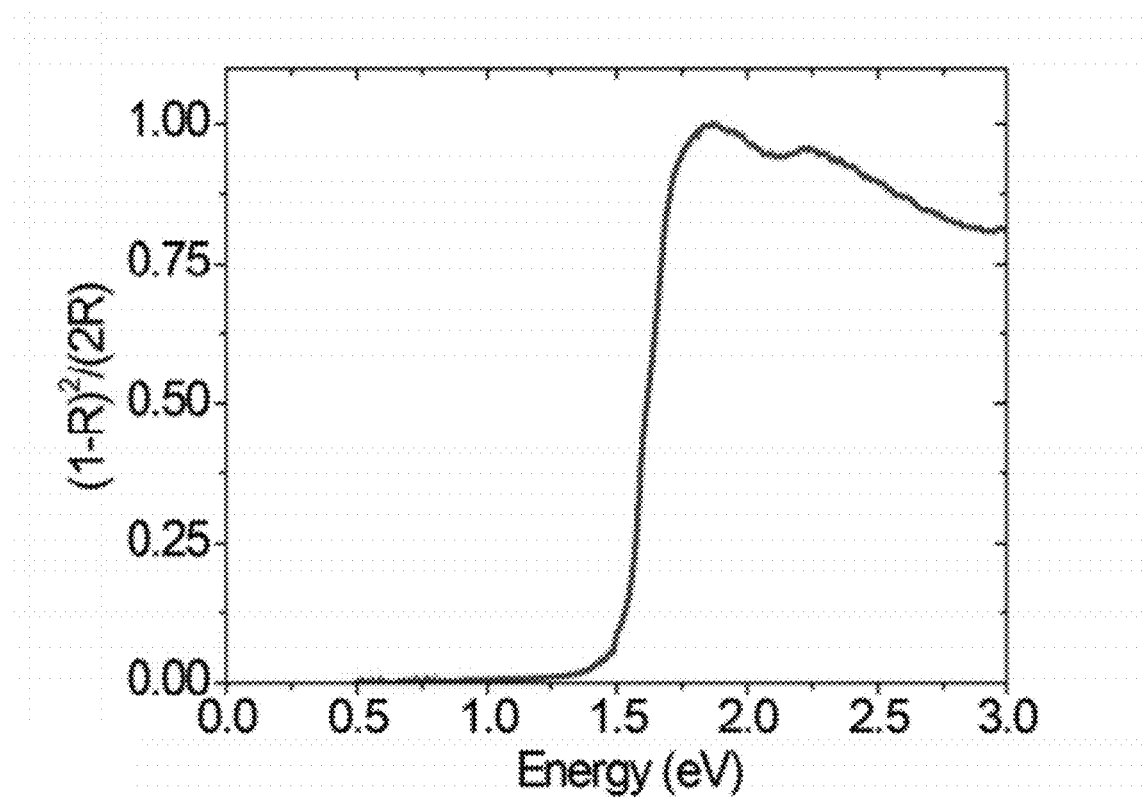
FIG. 10: Diffuse reflectance measurement on powdered $Tl_2Au_4S_3$ crystals.

The compound crystallized in the monoclinic C2/c with the unit cell shown in FIG. 8. Here a=10.779(2) Å, b=10.776(1) Å, c=15.663(5) Å and βI=99.993° (6). The calculated density was 6.41 gcm$^{-3}$, which is 1.1 times the density of CZT.

There is a large solubility of the different phases in each other within the series and the band gap can be engineered. In FIG. 8 the band gap change for $TlGaSe_{2-x}Te_x$ series is seen. Besides a lower band gap the Te$^-$ rich samples show a higher absorption due the higher average Z.

Example 4

$(A_2Q)_m(Au_2Q)_n$ with A=Na, K, Rb, Cs or Tl; and Q=S, Se, or Te $Tl_2Au_4S_3$ was synthesized using both direct combination as well as in a $Tl_2$, S flux. The room temperature resistivity was measured on some of these flux synthesized $Tl_2Au_4S_3$ samples and is approximately $2\times10^9$ Ωcm and hence in the desirable range.

Figure 11:
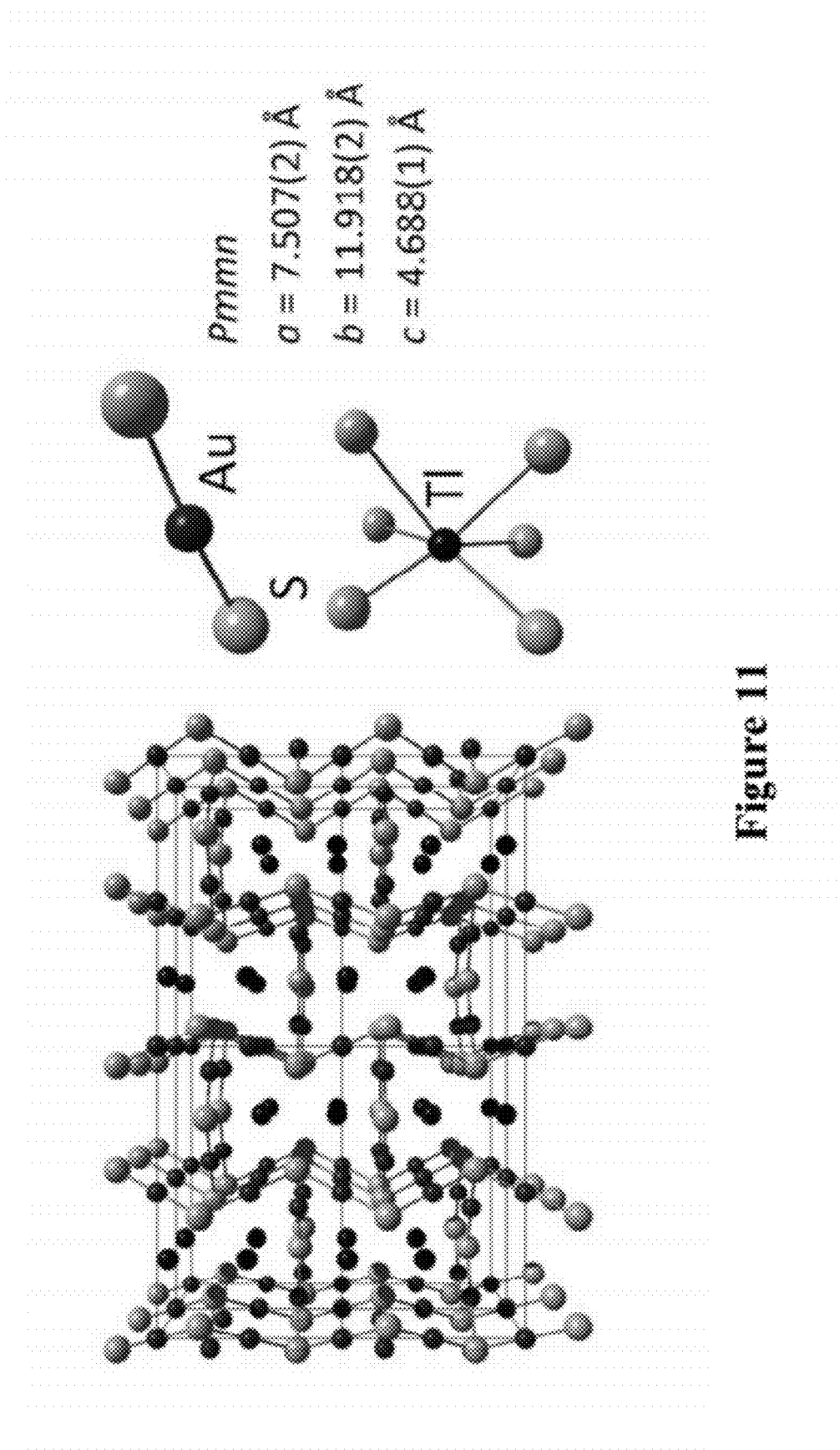
FIG. 11: Crystal structure of $Tl_2Au_4S_3$ with the coordination environments of Tl and Au shown on the right.

$Tl_2Au_4S_3$ is almost twice as dense as CZT and has an extremely high ratio of high Z elements for a wide band gap semiconductor. For radiation energies over 0.1 MeV the calculated absorption is 2-5 times that of CZT (see FIG. 2). The compound crystallizes in an orthorhombic crystal structure in the Pmmn space group (see FIG. 11). It has a 3 dimensional structure, which promotes good electronic and mechanical properties.

Example 5

Figure 12:
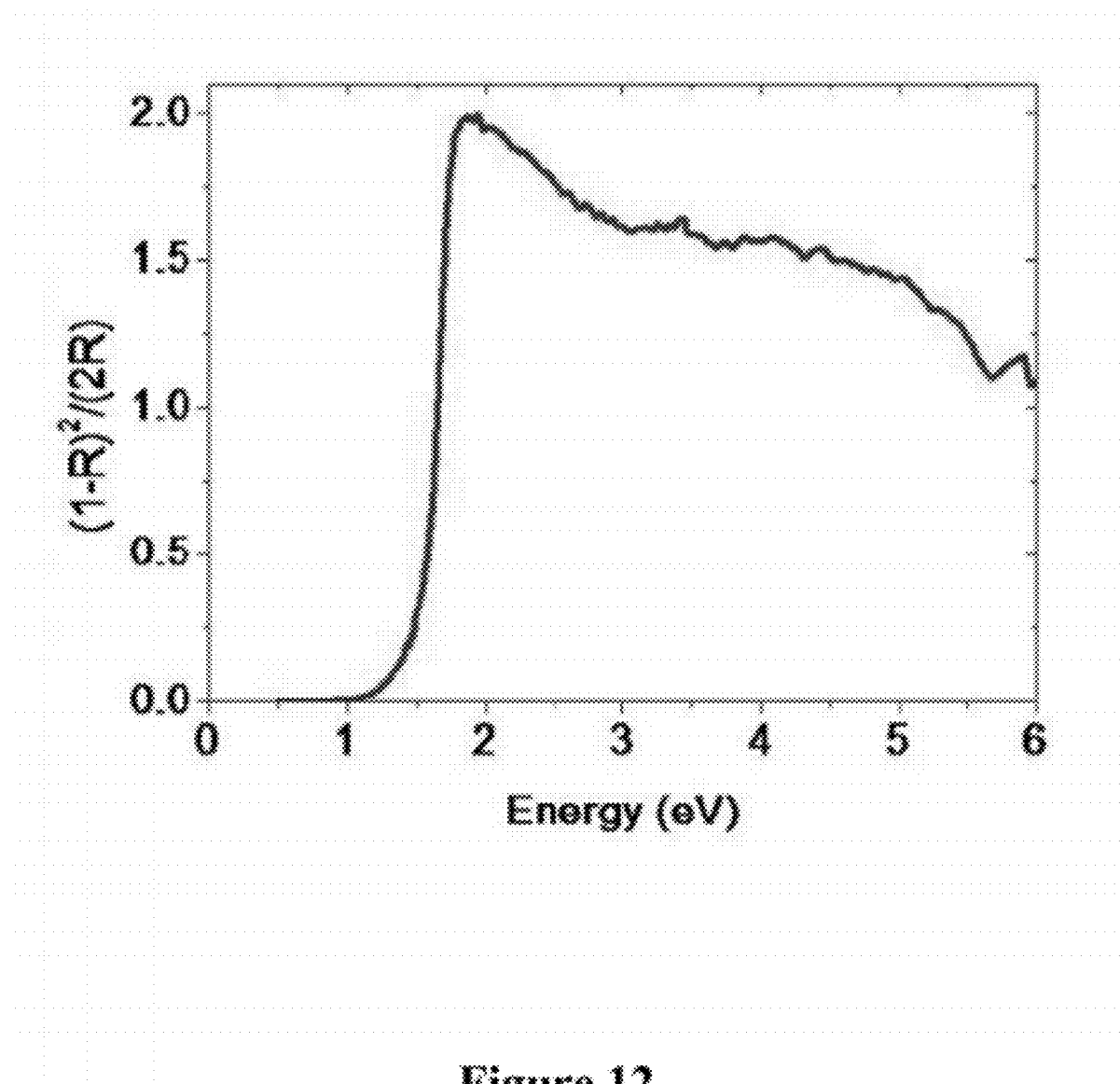
FIG. 12: Diffuse reflectance measurement on powdered $Tl_3SbS_3$.

$(A_2Q)_m(P_{n2}Q_3)_n$ with A=Na, K, Rb, Cs or Tl; Pn=P, As, Sb, or Bi; and Q=S, Se, or Te Here, $Tl_3SbS_3$ serves as an illustrative example. This compound is congruently melting at 342° C. and has a reported band gap of 1.7 eV. Specimens with resistivity of $10^{10}$ Ωcm have been reported (A. Ibanez et al., Materials Research Bulletin 20, 921 (1985)). The sample was synthesized using pre-synthesized $Tl_2S$ and $Sb_2S_3$. The sample was pre-reacted at 500° C. and then vertically Bridgman grown in a dual-zone furnace with the top zone at 450° C. and the bottom zone at 200° C. The measured band gap was 1.6 eV. Measurements of resistivity on a wafer cut from the sample in FIG. 12, indicated a resistivity in the GΩcm range.

TABLE 1

Experimental and calculated properties for a selection of compounds. CZT is added to the table for comparison. 662 keV corresponds to Cs-137 γ-radiation.

| Material | Atomic number for elements in material | Density (gcm$^{-3}$) | Band gap (eV) | Resistivity (Ωcm) | $\mu_{662\,keV}$ (cm$^{-1}$) | Reference |
|---|---|---|---|---|---|---|
| $Cd_{0.9}Zn_{0.1}Te$ | 48, 30, 52 | 5.78 | 1.57 | $10^{11}$ | 0.439 | A. Owens, Journal of Synchrotron Radiation 13, 143 (2006). |
| $HgGa_2S_4$ | 80, 31, 16 | 5.01 | 2.8 | $10^{10}$ | 0.451 | J. A. Beun, M. Lichtensteiger, and R. Nitsche, Physica 27, 448 (1961) |
| $HgGa_2Se_4$ | 80, 31, 34 | 6.21 | 1.8 | 1.4.107 | 0.515 | J. A. Beun, M. Lichtensteiger, and R. Nitsche, Physica 27, 448 (1961) & this disclosure. |
| $HgIn_2S_4$ | 80, 49, 16 | 5.87 | 2.0 | 2.107 | 0.523 | J. A. Beun, R. Nitsche, and M. Lichtensteiger, Physica 26, 647 (1960). |
| $PbGa_2Se_4$ | 82, 31, 34 | 6.03 | 2.2 | 1012 | 0.507 | B. G. Tagiev, N. N. Musaeva, and R. B. Dzhabbarov, Semiconductors 36, 273 (2002) & this disclosure. |
| $PbIn_2Se_4$ | 82, 49, 34 | 6.41 | — | — | 0.540 | This disclosure. |
| $Tl_2Au_4S_3$ | 81, 79, 16 | 10.23 | 1.5 | 2.109 | 1.101 | S. Loken, C. Felser, and W. Tremel, Chemical Communications, 1603 (1998) & this disclosure. |

TABLE 1-continued

Experimental and calculated properties for a selection of compounds. CZT is
added to the table for comparison. 662 keV corresponds to Cs-137 γ-radiation.

| Material | Atomic number for elements in material | Density (gcm$^{-3}$) | Band gap (eV) | Resistivity (Ωcm) | $\mu_{662\,keV}$ (cm$^{-1}$) | Reference |
|---|---|---|---|---|---|---|
| TlGaSe$_2$ | 81, 31, 34 | 6.19 | 2.0 | 1010 | 0.558 | O. Madelung, Semiconductors: Data Handbook (Springer, Berlin, 2004) & this disclosure. |
| Tl$_3$SbS$_3$ | 81, 51, 16 | 7.16 | 1.7 | 1010 | 0.735 | A. Ibanez et al., Materials Research Bulletin 20, 921 (1985) & this disclosure. |
| Tl$_2$SnS$_3$ | 81, 50, 16 | 6.37 | 1.6 | >107 | 0.636 | A. Ibanez et al., Revue De Chimie Minerale 23, 281 (1986) & this disclosure. |

Example 6

Figure 13:
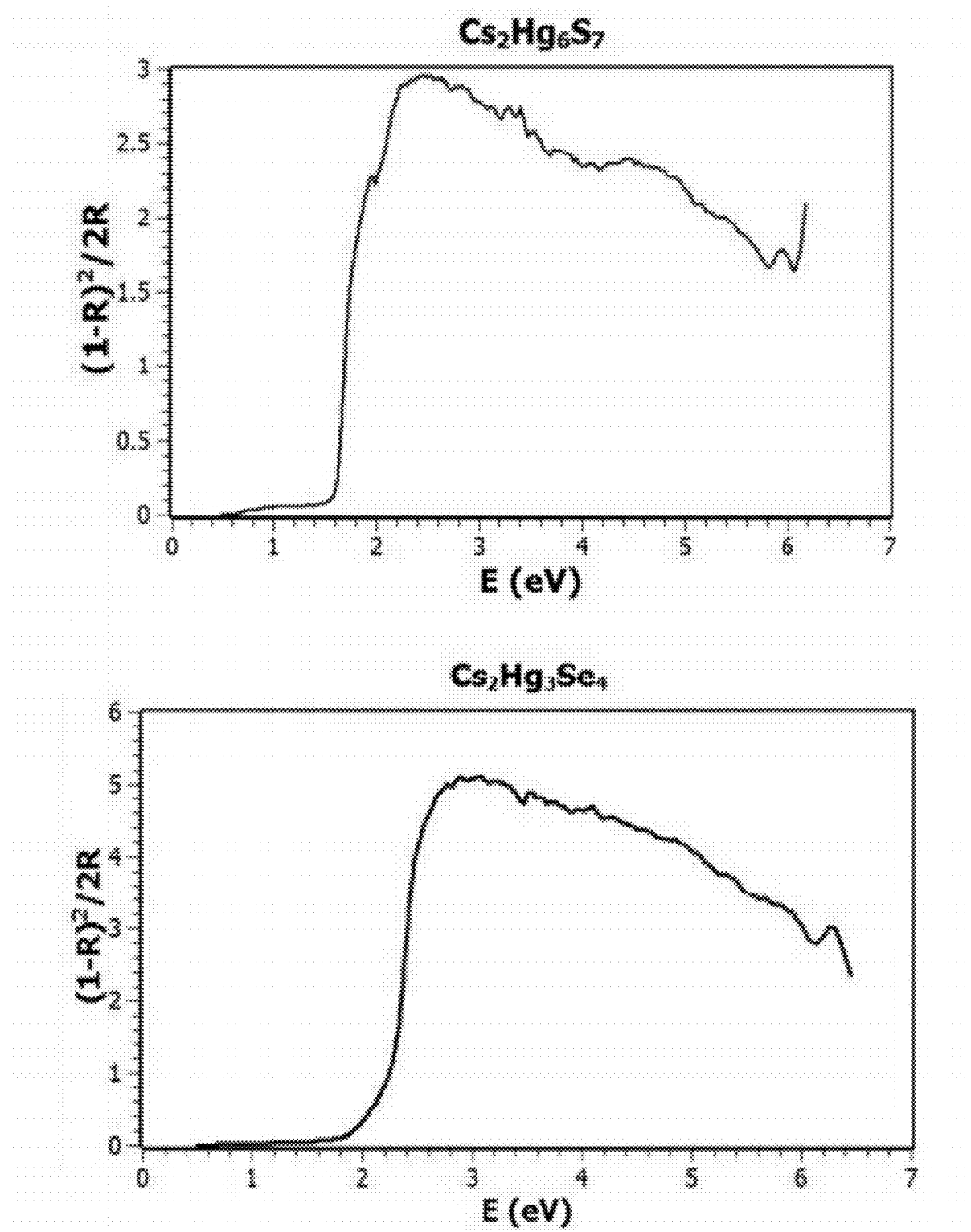
FIG. 13: (Left) Diffuse reflectance measurement of pulverized $Cs_2Hg_6S_7$ showing a gap of 1.6 eV. (Right) Diffuse reflectance measurement of pulverized $Cs_2Hg_3Se_4$ that shows a gap of 2.1 eV.
Figure 14A:
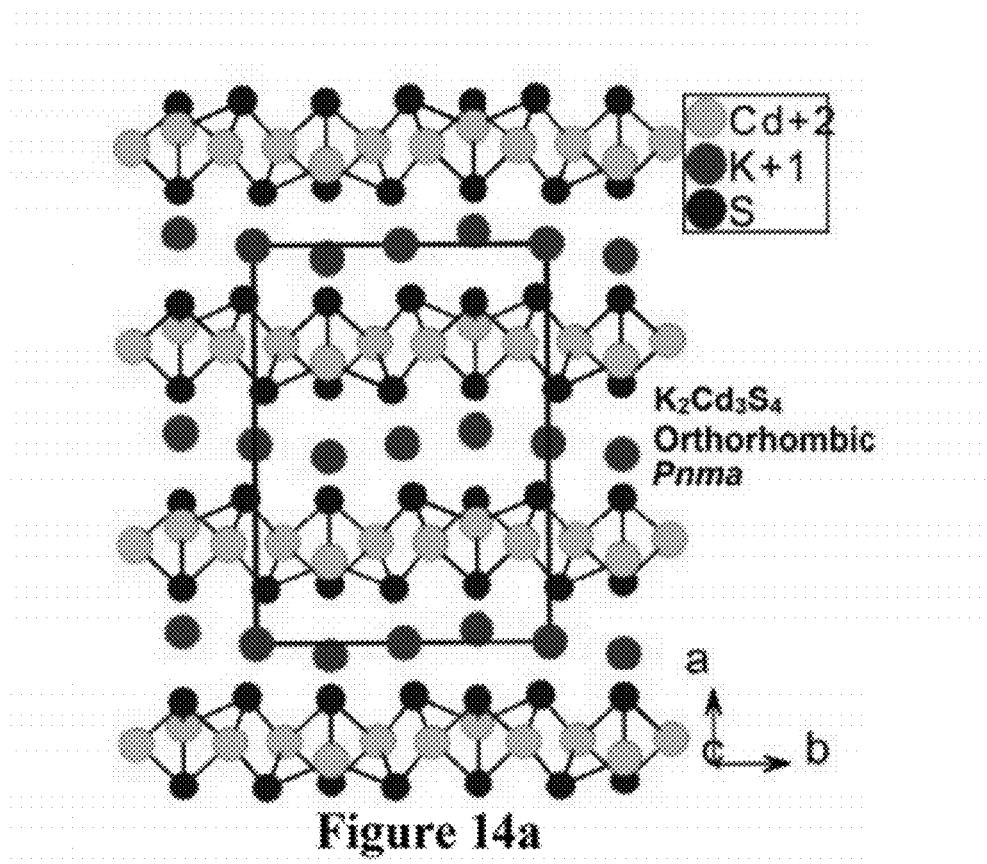
FIG. 14(a)-14(d): Different structure types in $A_2M_3Q_4$ family.
Figure 14B:
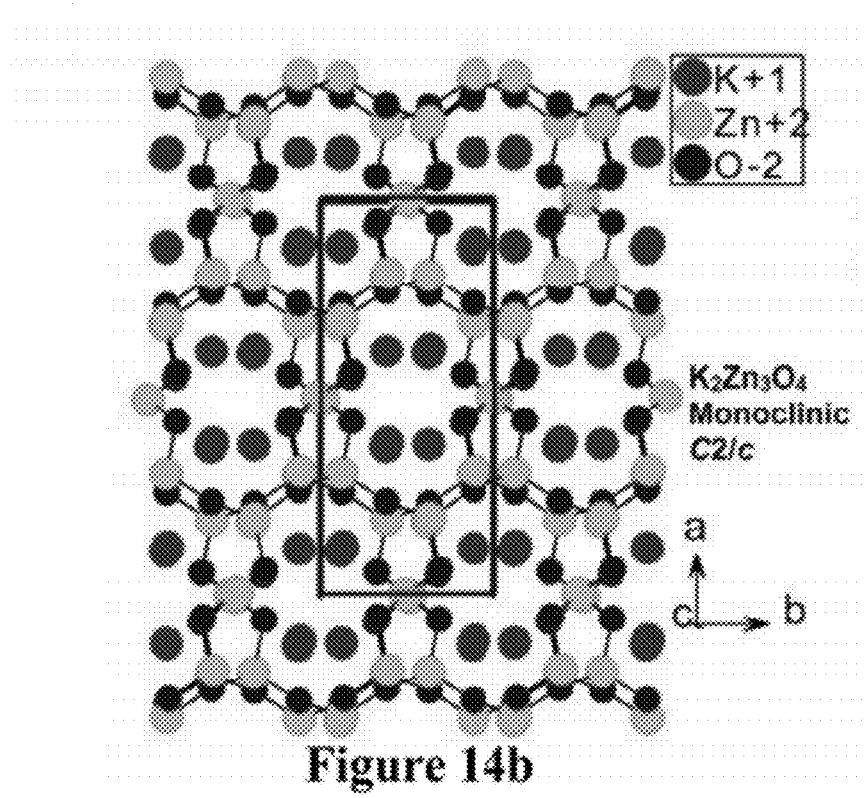
Figure 14C:
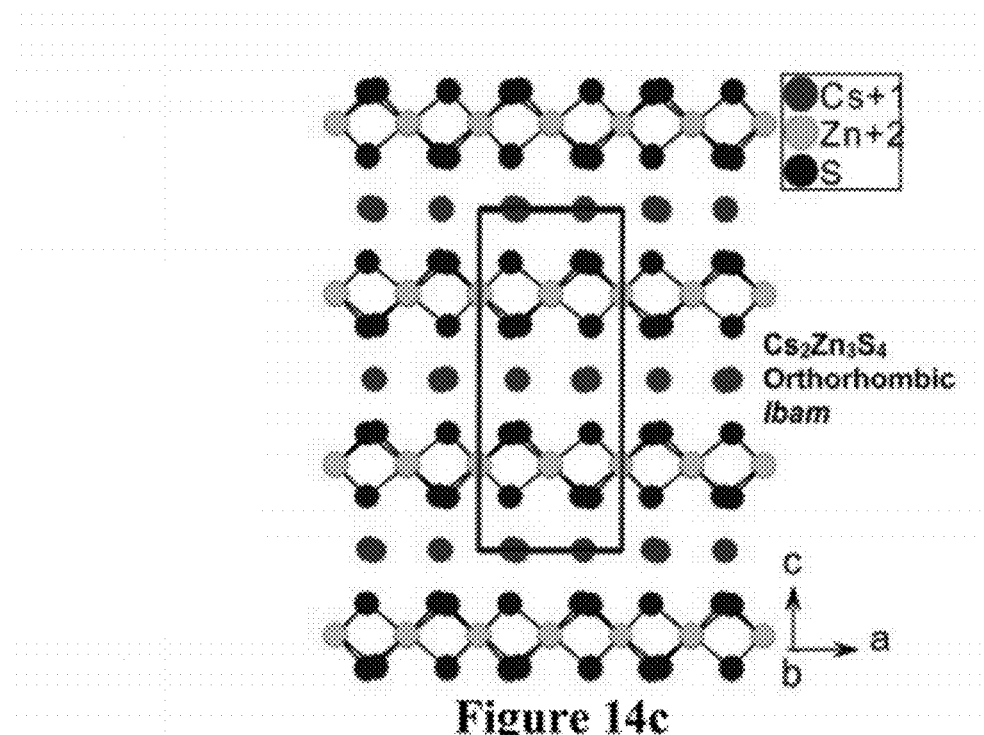
Figure 14D:
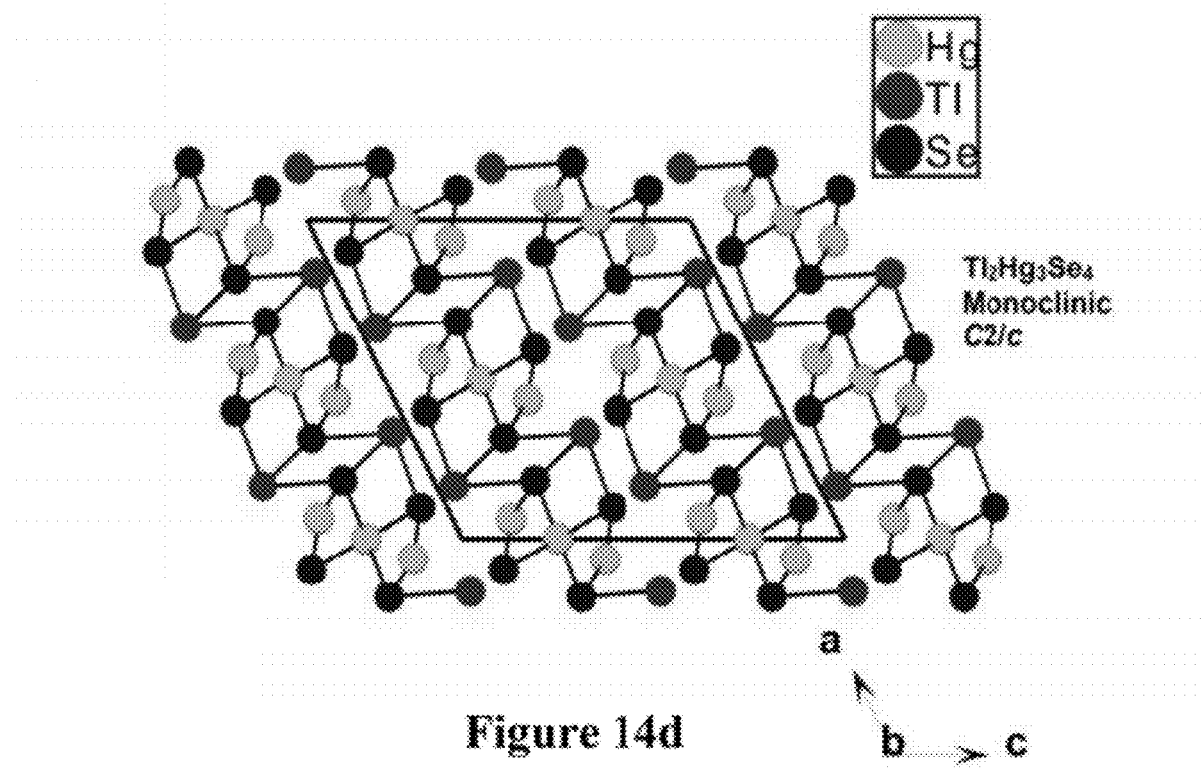

(A$_2$Q)$_m$(BQ)$_n$ with A=Na, K, Rb, Cs or Tl; B=Cd, or Hg; and Q=S, Se, or Te There are a few compounds having this structure. Some are tabulated in Table 2 with their important properties. Both Cs$_2$Hg$_6$S$_7$ and Cs$_2$Hg$_3$Se$_4$ were synthesized using different chemical routes involving direct combination of elements and pre-reaction in a protected non-oxidizing environment, or different combinations of the involved binary compounds as the starting materials. The reactions in all cases can be scaled up to batches of 10 g and thus Bridgman and Bridgman-Stockbarger furnace growth of large single crystalline boules is possible. The compounds exhibit high mass densities and band gaps within the desired region (FIG. 13).

Figure 15:
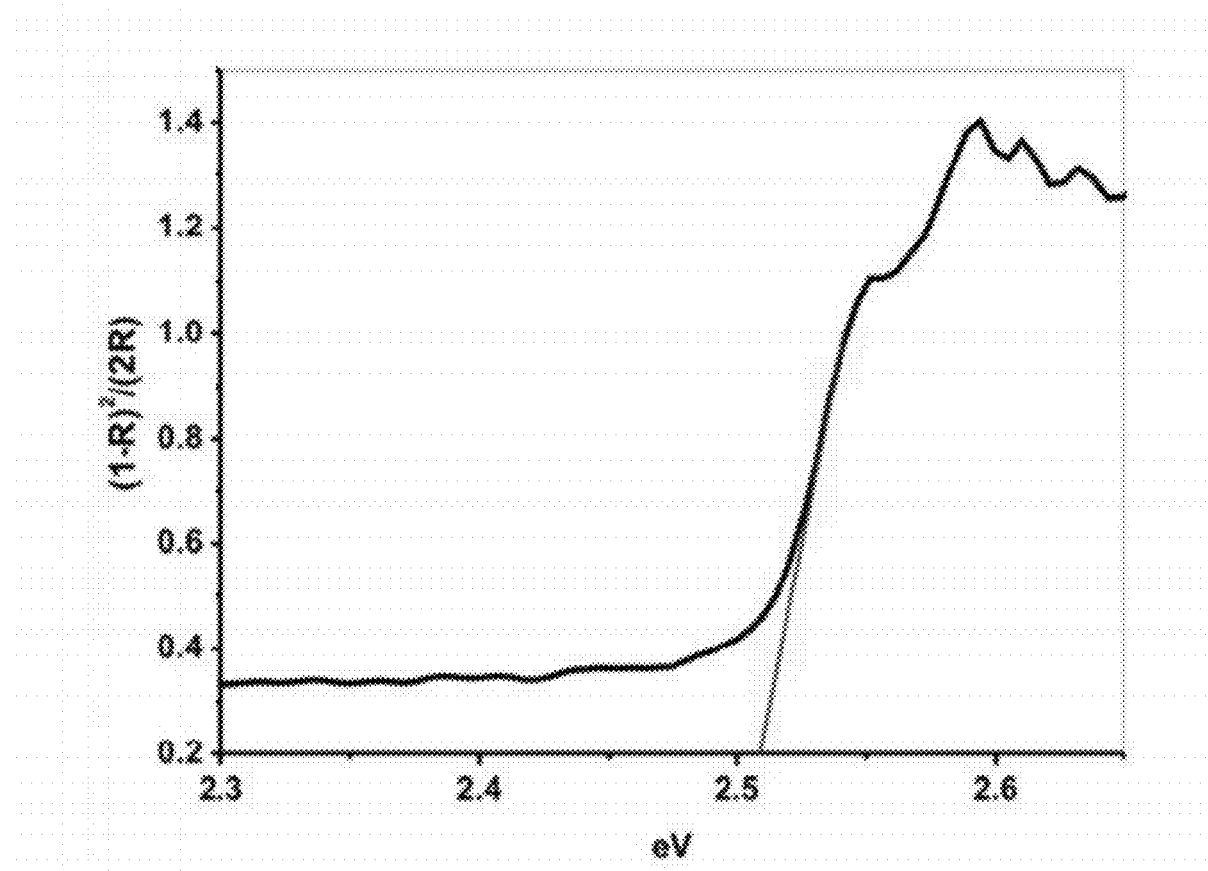
FIG. 15: Diffuse reflectance measurement on powdered $Cs_2Cd_3Te_4$ crystals.

A$_2$M$_3$Q$_4$ (A=K, Rb, or Cs; M=Mn, Co, Zn, or Cd; and Q=S, Se, or Te) (A. A. Narducci, and J. A. Ibers, J Alloy Compd 306, 170 (2000)) crystallizes in three different structure types (FIG. 14), K$_2$Cd$_3$S$_4$-type (space group: Pnma), Cs$_2$Zn$_3$S$_4$-type (space group: Ibam), and K$_2$Zn$_3$O$_4$-type (space group: C2/c). These systems have anionic extended frameworks with cations in cavities, between layers, as counterions to chains or molecular entities (A. A. Narducci, and J. A. Ibers, J Alloy Compd 306, 170 (2000); E. A. Axtell et al., Chemistry-a European Journal 2, 656 (1996); and J. Li et al., Inorg. Chem. 36, 684 (1997)). Systems with cationic extended frameworks ([M$_3$Q$_4$]$^{2-}$ can act as X- and gamma ray detectors. These include wide band gap semiconductors with E$_g$ ranging from 1.5 to 2.6 eV. For example, the band gap of Cs$_2$Cd$_3$Te$_4$ is ~2.5 (FIG. 15). A few examples with experimental details are shown in Table 2. Tl$_2$Hg$_3$Q$_4$ (Q=S, Se, or Te) is a new member in the A$_2$M$_3$Q$_4$ family with a new structure type.

Narducci et al. (A. A. Narducci, and J. A. Ibers, J Alloy Compd 306, 170 (2000)) made a generalization of the A$_2$M$_3$Q$_4$ family based on their A:M ionic radius. The compounds that adopt the K$_2$Cd$_3$S$_4$ structure type have 1.77≧A: M≦1.95 with 6-coordinate A atoms, whereas the Cs$_2$Zn$_3$S$_4$-type compounds have A:M≧2.23 with 8-coordinate A atoms. K$_2$Zn$_3$O$_4$-type compounds stay in between these two types of structures. However, in Tl$_2$Hg$_3$Se$_4$ the Tl:Hg ionic radius ratio is 1.24, which is far below these ranges and it crystallized in a new structure type. Though Rb$_2$Cd$_3$Te$_4$ also crystallizes in the same monoclinic C2/c space group, its two dimensional nature was due to the Cd$_3$Te$_4$ layers, separated by alkali Rb atoms (A. A. Narducci, and J. A. Ibers, J Alloy Compd 306, 170 (2000)).

Figure 16:
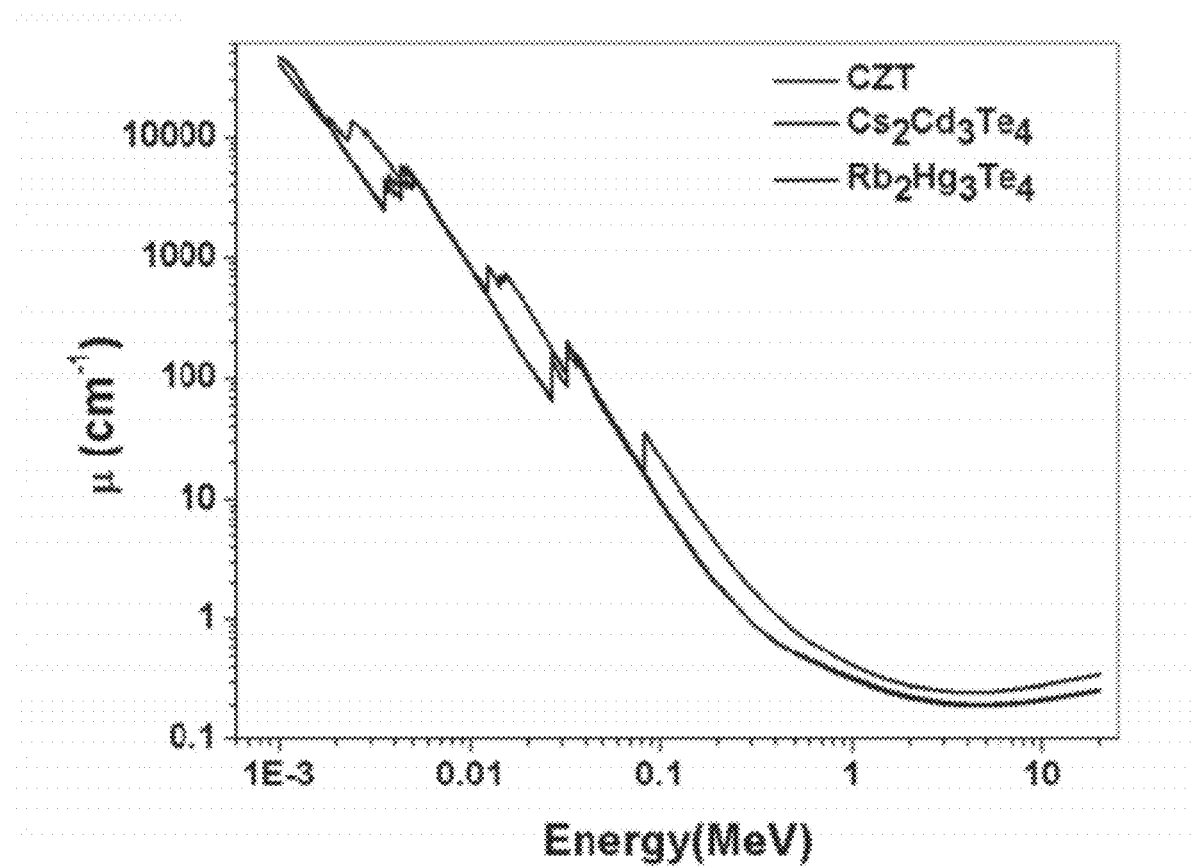
FIG. 16: Calculated absorption of $Cs_2Cd_3Te_4$ and $Rb_2Cd_3Te_4$. CZT is added for comparison.

In FIG. 16 the calculated absorption of two proposed compounds is shown with CZT for comparison. This is using the absorption calculated using tables of X-ray mass attenuation coefficients calculated by the National Institute of Standards and Technology. It is seen that the proposed compounds perform as well as, or outperform, CZT across the entire energy range (logarithmic scale). Notably in the high energy region the proposed materials show superior absorption.

As an example, Cs$_2$Cd$_3$Te$_4$ has been synthesized using direct combination of elements in a protected non-oxidizing environment, or different combinations of the involved binary compounds as the starting materials. DTA measurement show it is congruently melting which facilitates the growth of the large single crystals using a Bridgman-Stockbarger furnace. A$_2$M$_3$Q$_4$ exhibited high mass densities and band gaps within the desired region (Table 2).

TABLE 2

Experimental and calculated properties for a
selection of compounds in the A$_2$M$_3$Q$_4$ family.
CZT is added to the table for comparison.

| Material | Atomic number for elements in the material | Density (gcm$^{-3}$) | Band gap (eV) | $\mu_{662\,keV}$ (cm$^{-1}$) | Reference |
|---|---|---|---|---|---|
| Cd$_{0.9}$Zn$_{0.1}$Te | 48, 30, 52 | 5.78 | 1.57 | 0.439 | A. Owens, Journal of Synchrotron Radiation 13, 143 (2006). |

TABLE 2-continued

Experimental and calculated properties for a
selection of compounds in the $A_2M_3Q_4$ family.
CZT is added to the table for comparison.

| Material | Atomic number for elements in the material | Density (gcm$^{-3}$) | Band gap (eV) | $\mu_{662\,keV}$ (cm$^{-1}$) | Reference |
|---|---|---|---|---|---|
| Rb$_2$Cd$_3$Te$_4$ | 37, 48, 52 | 6.64 | 1.42 | 0.499 | J. Li et al., Inorg. Chem. 36, 684 (1997) & this disclosure. |
| Cs$_2$Cd$_3$Te$_4$ | 55, 48, 52 | 5.54 | 2.50 | 0.425 | A. A. Narducci, and J. A. Ibers, J Alloy Compd 306, 170 (2000) & this disclosure. |
| Rb$_2$Cd$_3$S$_4$ | 37, 48, 16 | 4.31 | 2.92 | 0.325 | E. A. Axtell et al., Chemistry-a European Journal 2, 656 (1996). |
| Rb$_2$Cd$_3$Se$_4$ | 37, 48, 34 | 4.95 | 2.37 | 0.362 | E. A. Axtell et al., Chemistry-a European Journal 2, 656 (1996). |
| K$_2$Cd$_3$Te$_4$ | 19, 48, 52 | 4.93 | 2.26 | 0.374 | E. A. Axtell et al., Chemistry-a European Journal 2, 656 (1996). |
| Cs$_2$Hg$_3$Se$_4$ | 55, 80, 34 | 6.83 | 2.1 | 0.633 | This disclosure. |
| Cs$_2$Hg$_6$S$_7$ | 55, 80, 16 | 6.94 | 1.6 | 0.702 | This disclosure. |
| Tl$_2$Hg$_3$S$_4$ | 81, 80, 16 | 8.33 | 2.05 | 0.893 | This disclosure. |
| Tl$_2$Hg$_3$Se$_4$ | 81, 80, 34 | 8.98 | 1.57 | 0.909 | This disclosure. |
| Tl$_2$Hg$_3$Te$_4$ | 81, 80, 52 | 8.93 | Not measured | 0.885 | This disclosure. |

Tl$_2$Hg$_3$Q$_4$ with Q=S, Se or Te phases have previously been reported in investigations of the HgQ-Tl$_2$Q pseudo binary phase diagrams (M. B. Babanly, M. M. Asadov, and A. A. Kuliev, Inorganic Materials 19, 524 (1983)). However, neither crystal structures nor any physical properties have been reported for this compound. Synthesis was performed in a flux of excess Tl$_2$Q. Tl$_2$Q and HgQ were sealed in an evacuated carbon coated quartz tube. A vertical Bridgman using a single zone furnace kept at 450° C. was employed. The excess flux was removed by centrifuging at 400° C. The Tl$_2$Hg$_3$Q$_4$ crystallized in new structure type (FIG. 14).

Figure 17:
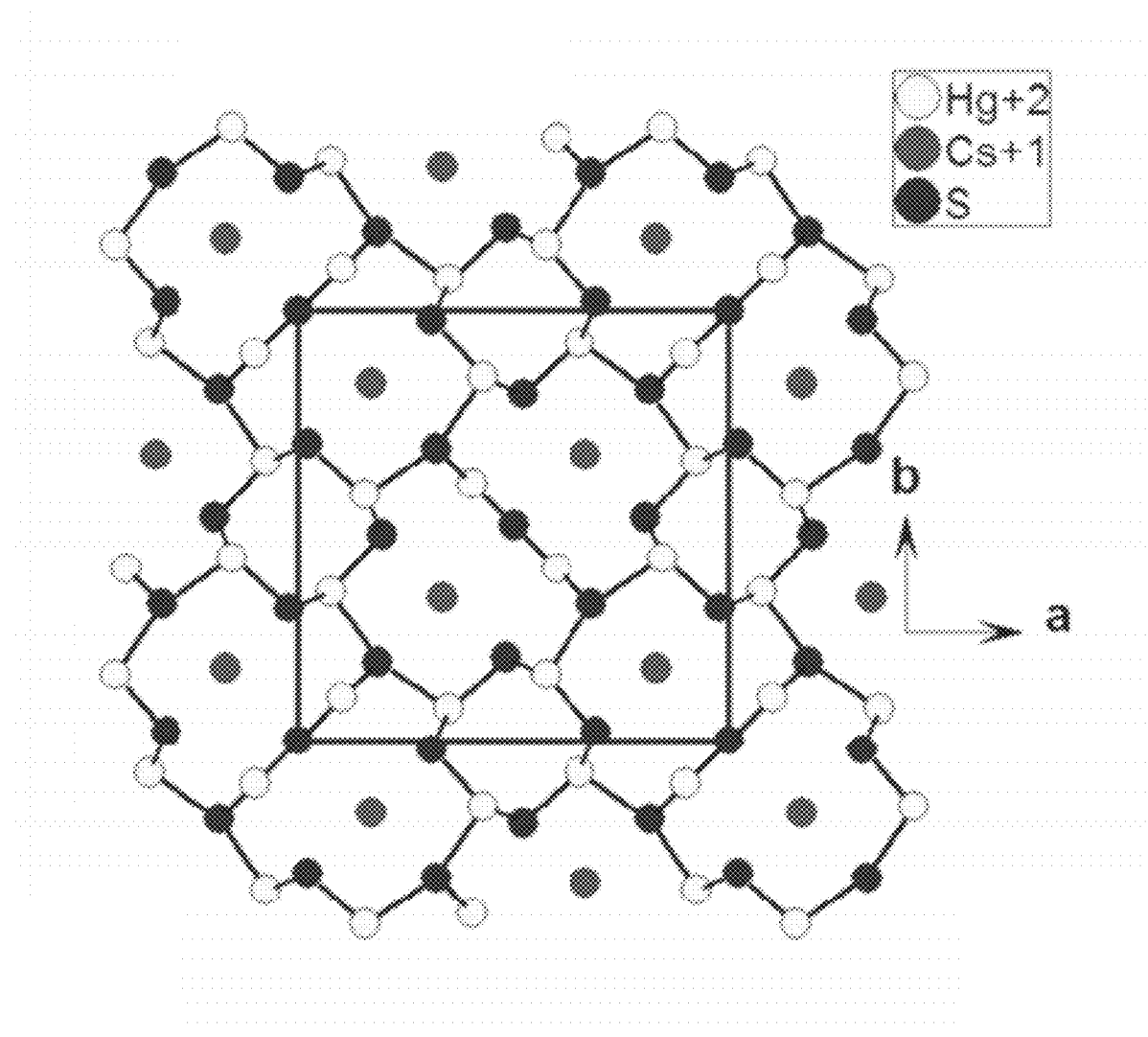
FIG. 17: Crystal structure of $Cs_2Hg_6S_7$ down c-axis.

For m=1 and n=6, Cs$_2$Hg$_6$S$_7$ serves as an example. Cs$_2$Hg$_6$S$_7$ crystallizes in a new structure type that is closely related to that of K$_2$Zn$_6$O$_7$; a tetragonal system with a=b=14.063(3) Å and c=4.1895(18) Å (D. E. Bugaris, and J. A. Ibers, Acta Crystallogr E 64, 155 (2008)). The structure comprises a three-dimensional mercury sulfide network that is composed of channels (FIG. 17). These channels, which are along [001], are of two different diameters. The crystal structure contains one Cs, two Hg, and three S atoms in the asymmetric unit. The Cs, one Hg, and one S atom are at sites of symmetry m, whereas a second S atom is at a site of symmetry 2 mm. The Hg atoms are bound to the S atoms in both three- and four-coordinate geometries.

Example 7

(Tl$_2$S)$_m$(SnS$_2$)$_n$

Figure 18:
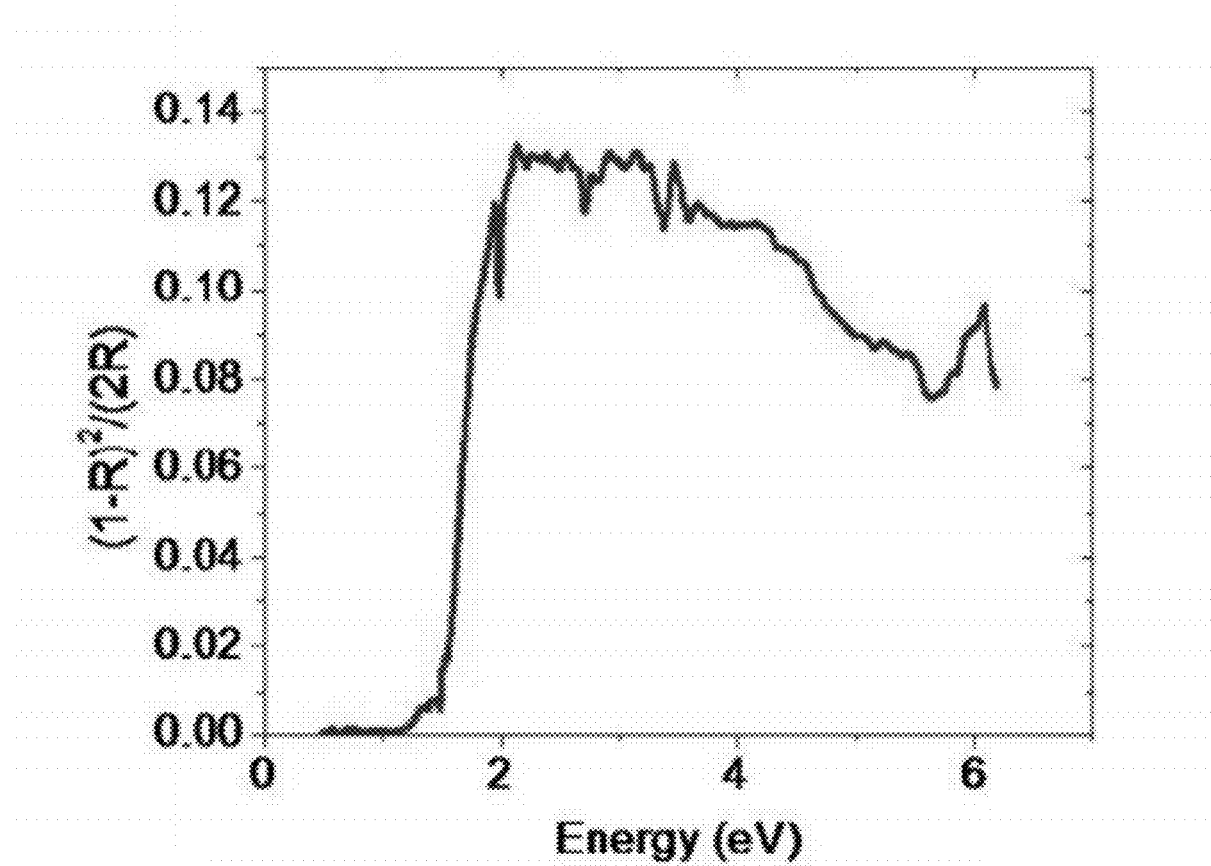
FIG. 18: Diffuse reflectance measurement on powdered $Tl_2SnS_3$.

For m=1 and n=1, the stoichiometry is Tl$_2$SnS$_3$. This compound melts congruently at 420° C. and forms as black crystals (A. Ibanez et al., Revue De Chimie Minerale 23, 281 (1986)). The sample shown in FIG. 18 was synthesized using Tl$_2$S and elemental Sn and S. Bridgman growth conditions were a single zone furnace kept at 500° C., whose temperature profile provided the appropriate conditions for crystallization. The sample had a band gap of 1.6 eV and a resistivity higher than 10$^7$ Ωcm.

Example 8

Figure 19:
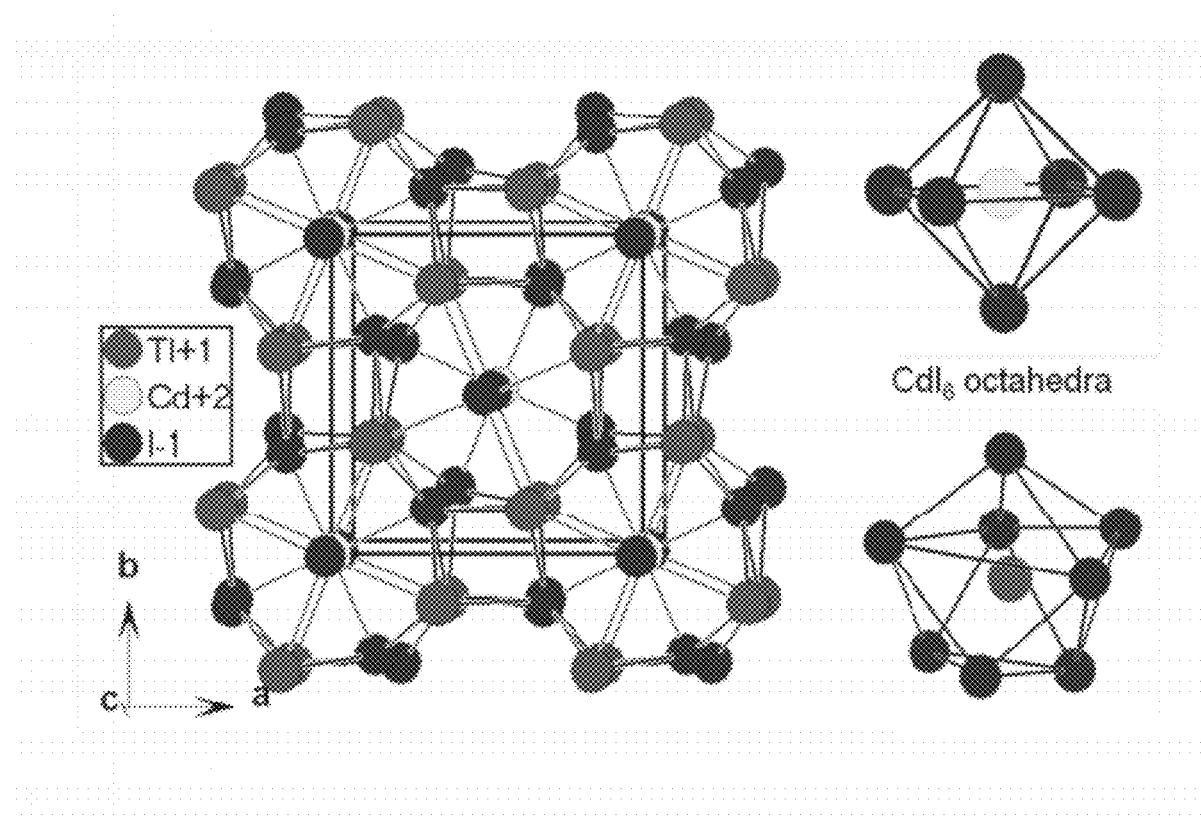
FIG. 19: Crystal structure of $Tl_4CdI_6$ along the c-axis. Thallium metal halides, $Tl_4HgX_6$ (X=I, Br) and thallium chalcohallides, $Tl_4MX_6$ (M=S, Se and X=Cl, Br, I) are also crystallized in the same structure type. The coordination sphere around the Cd and Tl atoms are shown on the right hand side of the figure.

(AX)$_m$(BX$_2$)$_n$ with A=Na, K, Rb, Cs or Tl; B=Cu, Zn, Cd, or Hg; and X=F, Cl, Br, or I These halides showed promising optical (Table 4 and FIG. 19) and electrical properties. Though they were considered as potential scintillators (M. Klintenberg, S. E. Derenzo, and M. J. Weber, Nucl Instrum Meth A 486, 298 (2002)), none of the above materials have hitherto been considered as radiation detector materials. In the structure of the tetragonal Tl$_4$CdI$_6$, c-direction compressed CdI$_6$ octahedra are situated.

TABLE 4

Experimental and calculated properties for a selection of thallium metal
halides. CZT is added to the table for comparison.

| Material | Atomic number for elements in the material. | Density g/cm$^3$ | Band gap eV | Resistivity (Ωcm) | $\mu_{662\,keV}$ (cm$^{-1}$) | Reference |
|---|---|---|---|---|---|---|
| Cd$_{0.9}$Zn$_{0.1}$Te | 48, 30, 52 | 5.78 | 1.57 | 10$^{11}$ | 0.439 | A. Owens, Journal of Synchrotron Radiation 13, 143 (2006). |

TABLE 4-continued

Experimental and calculated properties for a selection of thallium metal halides. CZT is added to the table for comparison.

| Material | Atomic number for elements in the material. | Density g/cm$^3$ | Band gap eV | Resistivity ($\Omega$cm) | $\mu_{662\,keV}$ (cm$^{-1}$) | Reference |
|---|---|---|---|---|---|---|
| Tl$_4$CdI$_6$ | 81, 48, 53 | 6.88 | 1.78 | 10$^8$ | 0.649 | R. L. Ammlung et al., J Solid State Chem 21, 185 (1977) & this disclosure. |
| Tl$_4$HgBr$_6$ | 81, 80, 35 | 7.00 | 1.81 | ~10$^7$ | 0.706 | H. Nagase, Y. Furukawa, and D. Nakamura, B Chem Soc Jpn 63, 3329 (1990) & this disclosure. |
| Tl$_4$HgI$_6$ | 81, 80, 53 | 7.15 | 1.27 | ~10$^7$ | 0.681 | H. Nagase, Y. Furukawa, and D. Nakamura, B Chem Soc Jpn 63, 3329 (1990) & this disclosure. |
| Tl$_4$Cu$_2$I$_6$ | 81, 29, 53 | 6.91 | 1.19 | 10$^{11}$ | 0.649 | M. Hoyer, and H. Hartl, Z Anorg Allg Chem 587, 23 (1990) & this disclosure. |

Figure 20:
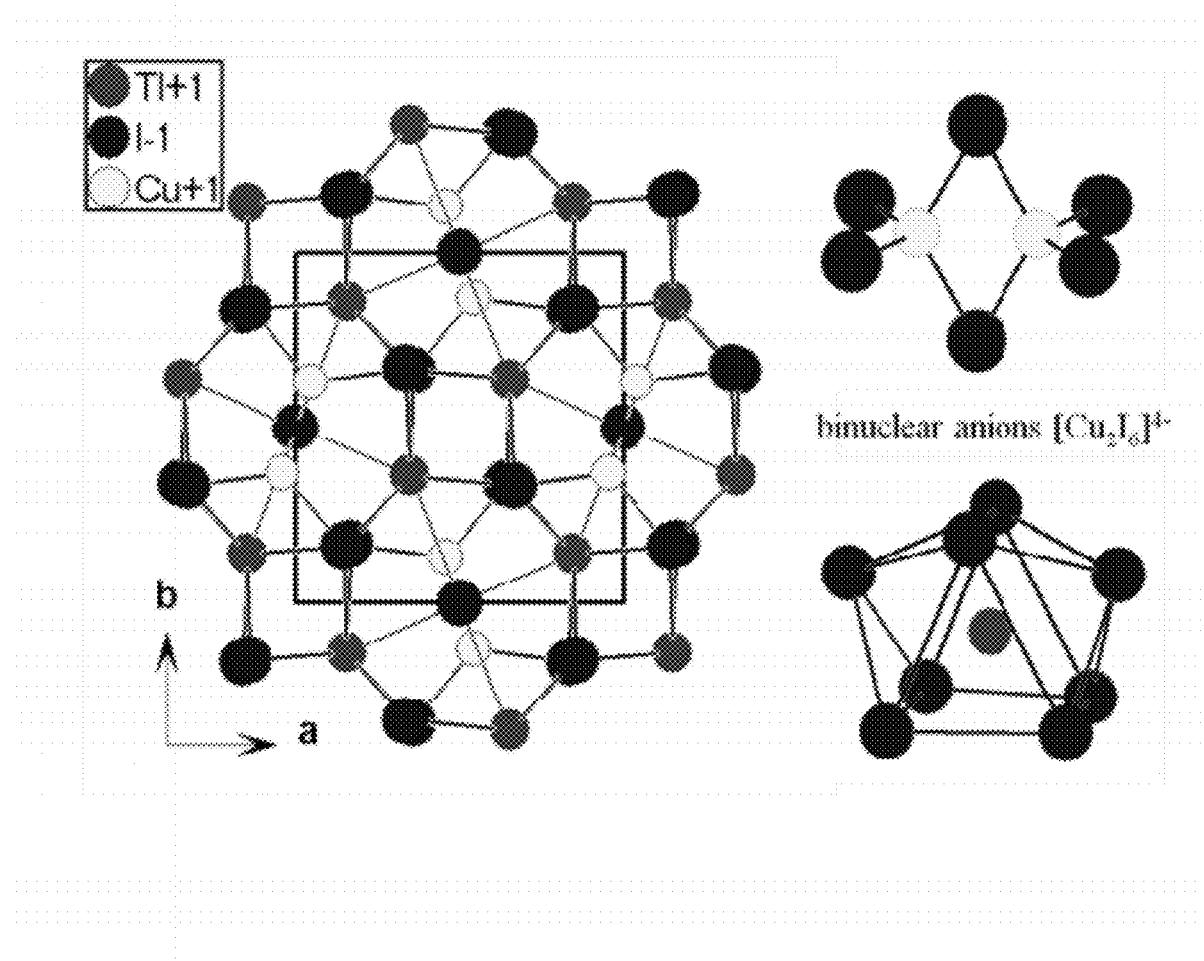
FIG. 20: Crystal structure of $Tl_4Cu_2I_6$ along the c-axis. The binuclear $[Cu_2I_6]^{4-}$ and Tl polyhedral are shown on the right hand side of the figure.

The cadmium (or mercury) atoms occupy statistically 4 positions in the equatorial plane of the octahedra in such a manner that strongly deformed CdI$_4$ (or HgI$_4$) tetrahedra are produced. The thallium atoms are eightfold coordinated like a bicapped trigonal prism. The crystal structure analysis of Tl$_4$Cu$_2$I$_6$ shows (FIG. 20) that the compound contains binuclear anions [Cu$_2$I$_6$]$^{4-}$ which are built up by edge sharing CuI$_4$-tetrahedra. The coordination of Tl$^I$ with I$^-$ is analogous to the yellow TlI.

Figure 21:
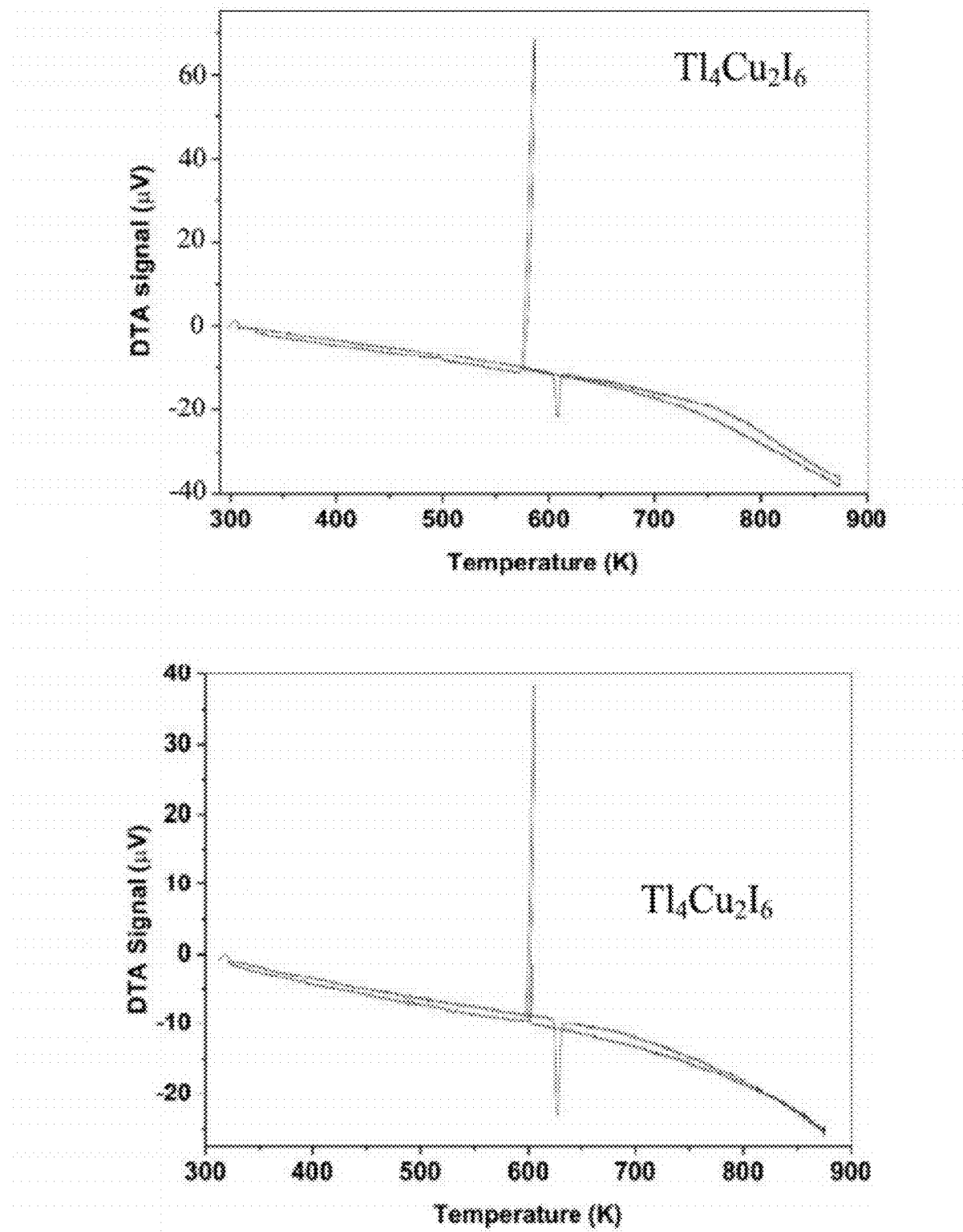
FIG. 21: Differential thermal analysis (DTA) signal of $Tl_4Cu_2I_6$ and $Tl_4CdI_6$
Figure 22A:
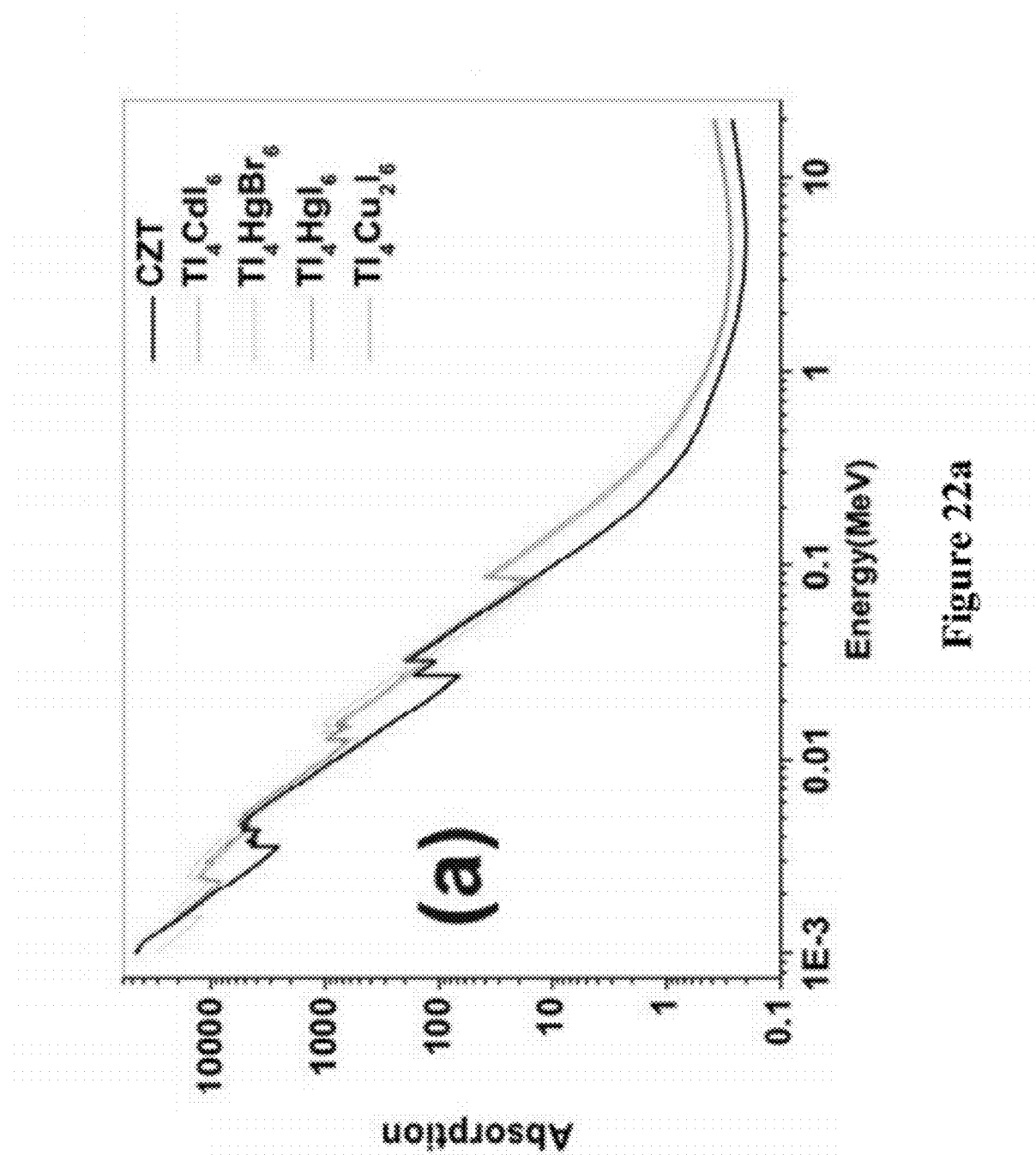
FIG. 22(a)-22(d): (a) Calculated attenuation coefficient for a few selected Tl metal halides compared with CZT. (b), (c) and (d) are diffuse reflectance measurement on powdered crystals of $Tl_4CdI_6$, $Tl_4Cu_2I_6$ and $Tl_4HgI_6$, respectively.
Figure 22B:
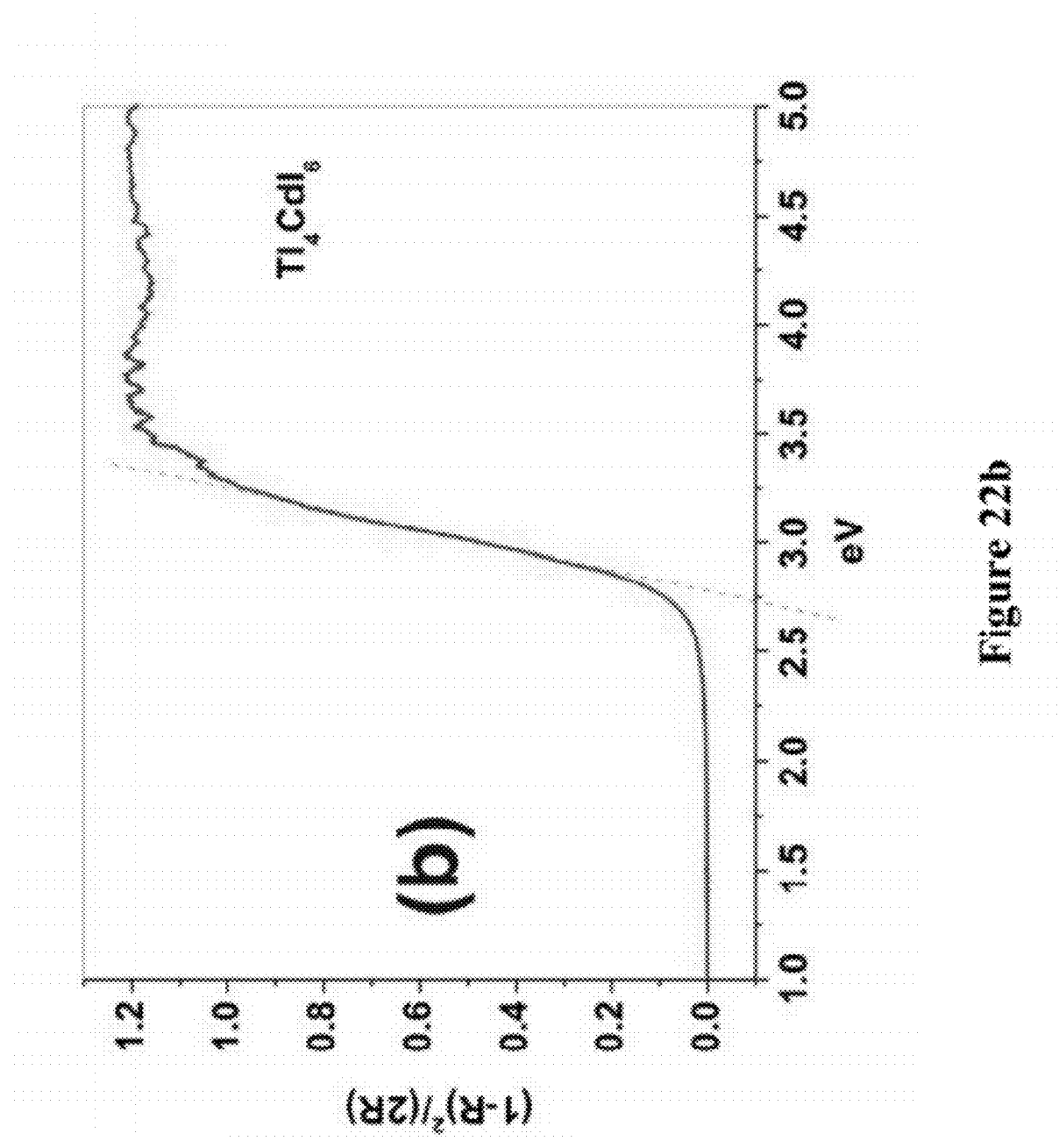
Figure 22C:
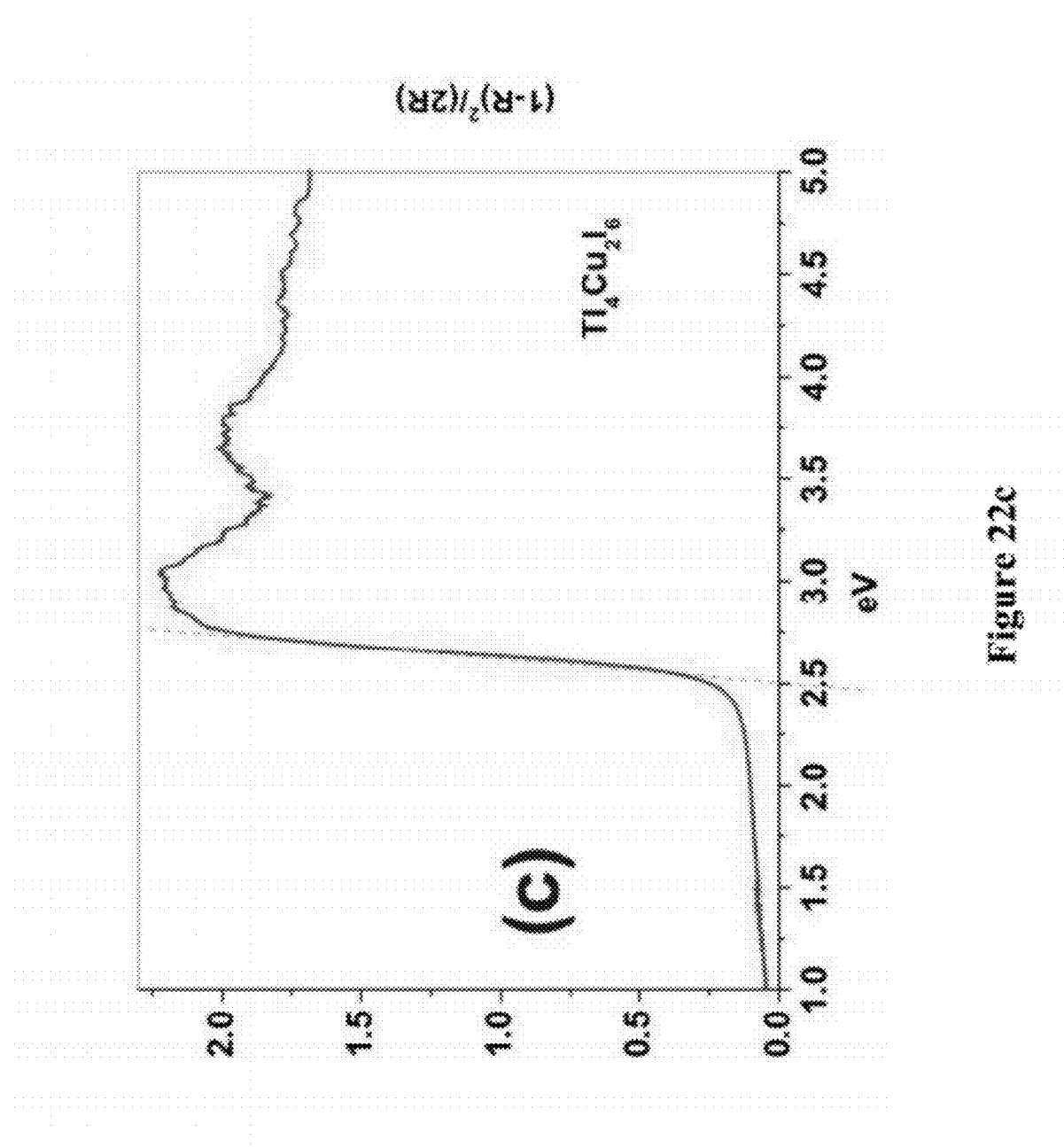
Figure 22D:
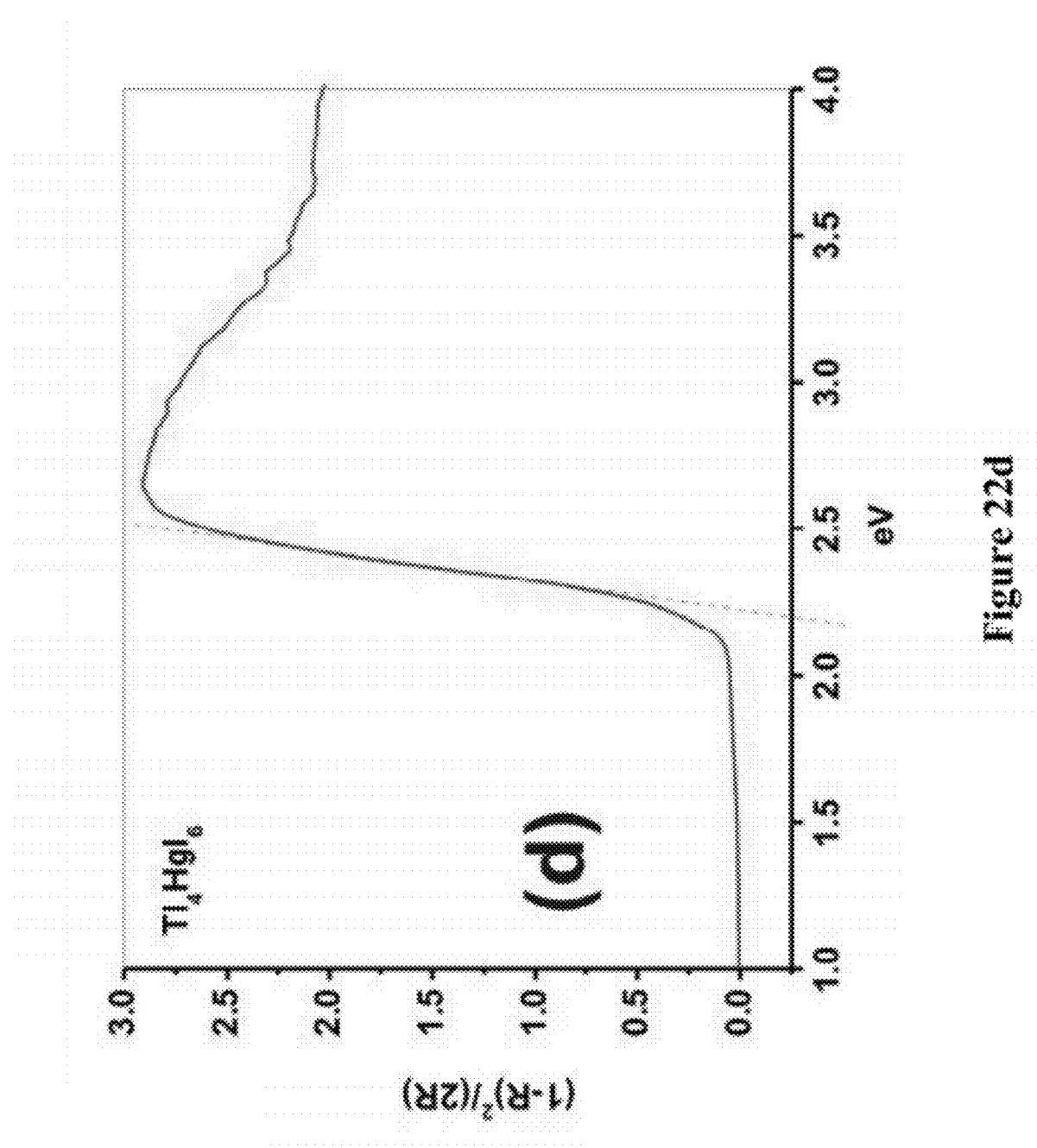

All these cationic framework materials are congruently melting which facilitates the ability to grow large crystals. DTA of two examples are shown in FIG. 21.

When melting is incongruent, crystals can be grown using molten salt techniques. Large single crystals of Tl$_4$HgI$_6$ were grown by the Bridgman method for non-linear optical applications. Large single crystals of Tl$_4$Cu$_2$I$_6$ were grown using the Bridgman method and their resistivity was measured with the range 10$^{11}$ $\Omega$cm. The calculated attenuation coefficients of a few of the compounds and the measured band gaps are shown in the FIG. 22.

Example 9

(A$_2$Q)$_m$(AX)$_n$ with A=Na, K, Rb, Cs or Tl; Q=S, Se, or Te; and X=F, Cl, Br, or I Here thallium chalco-halide compounds for radiation detector application are described. The compounds exemplified are Tl$_2$QX$_6$, Tl$_6$X$_4$Q, and Tl$_5$Q$_2$X (where X=Cl, Br, or I and Q=S or Se), which all show densities superior to CZT and band gaps in a range appropriate for semiconductor x-ray and gamma-ray detection at room temperature. All compounds are congruently melting, and can be grown as large crystals by either the Bridgman method or Czochralski pulling. Tl$_6$I$_4$Se serves as an illustrative example. Data for the remaining compounds are listed in Table 5.

Figure 23:
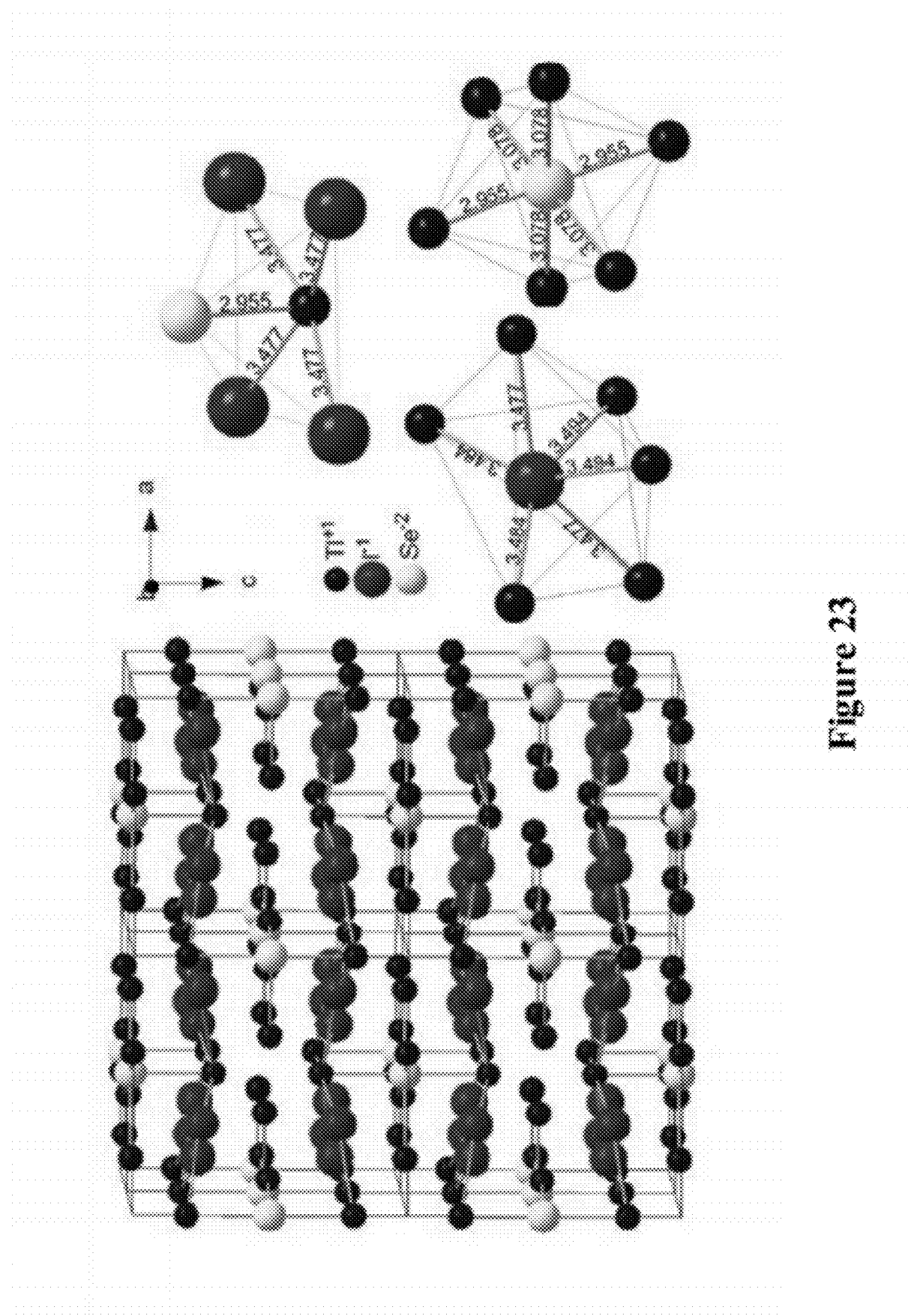
FIG. 23: 2×2×2 unit cell of $Tl_6I_4Se$ with the element coordination environments shown to the right.

Tl$_6$I$_4$Se crystallizes in a tetragonal P4/mnc space group with a=b=9.178 Å and c=9.675 Å. FIG. 23 shows the crystal structure of Tl$_6$I$_4$Se with the coordination environments shown to the right and the crystals shown on the left. It has a three-dimensional structure which can provide good intrinsic electronic properties and good mechanical properties compared to layered or linear compounds. Preliminary electronic band structure calculations confirmed the promising electronic properties: Both conduction and valence bands are highly dispersed, which implies small band effective masses. Since the mobility scales inversely with the band effective mass, this ultimately implies high charge carrier mobilities.

Figure 24:
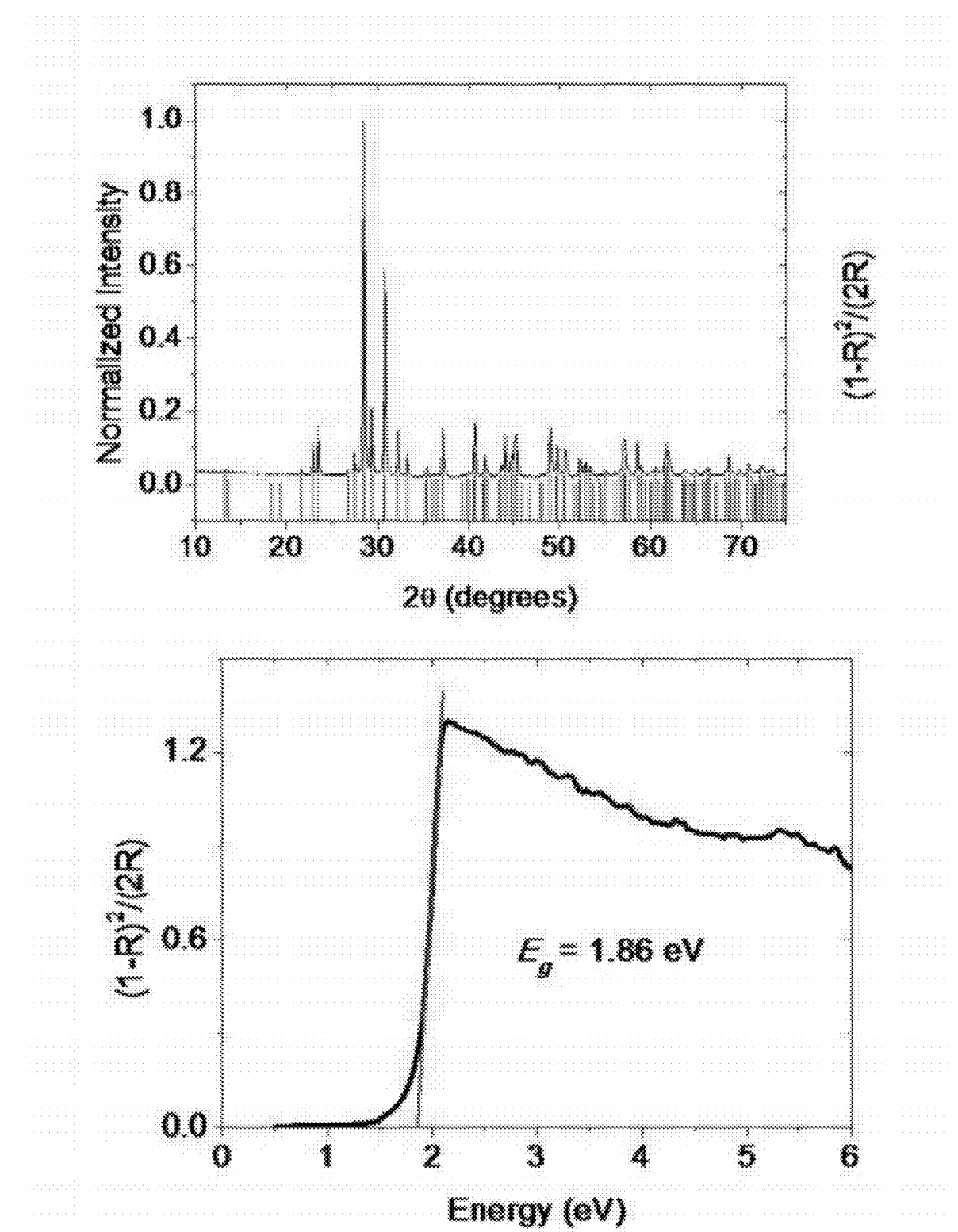
FIG. 24: (Left) Powder x-ray diffraction of $Tl_6I_4Se$ (black curve). Theoretical peaks are shown by red markers. (Right) Optical absorption spectrum of $Tl_6I_4Se$ indicating a band gap of 1.86 eV.

The x-ray powder diffraction pattern of Tl$_6$I$_4$Se is shown in FIG. 24 and, within the resolution of the present data, phase pure Tl$_6$I$_4$Se was obtained. The material forms as transparent red crystals (thick crystals look black but are transparent red at the edges). The experimentally measured band gap of 1.86 eV is shown in FIG. 24.

Figure 25:
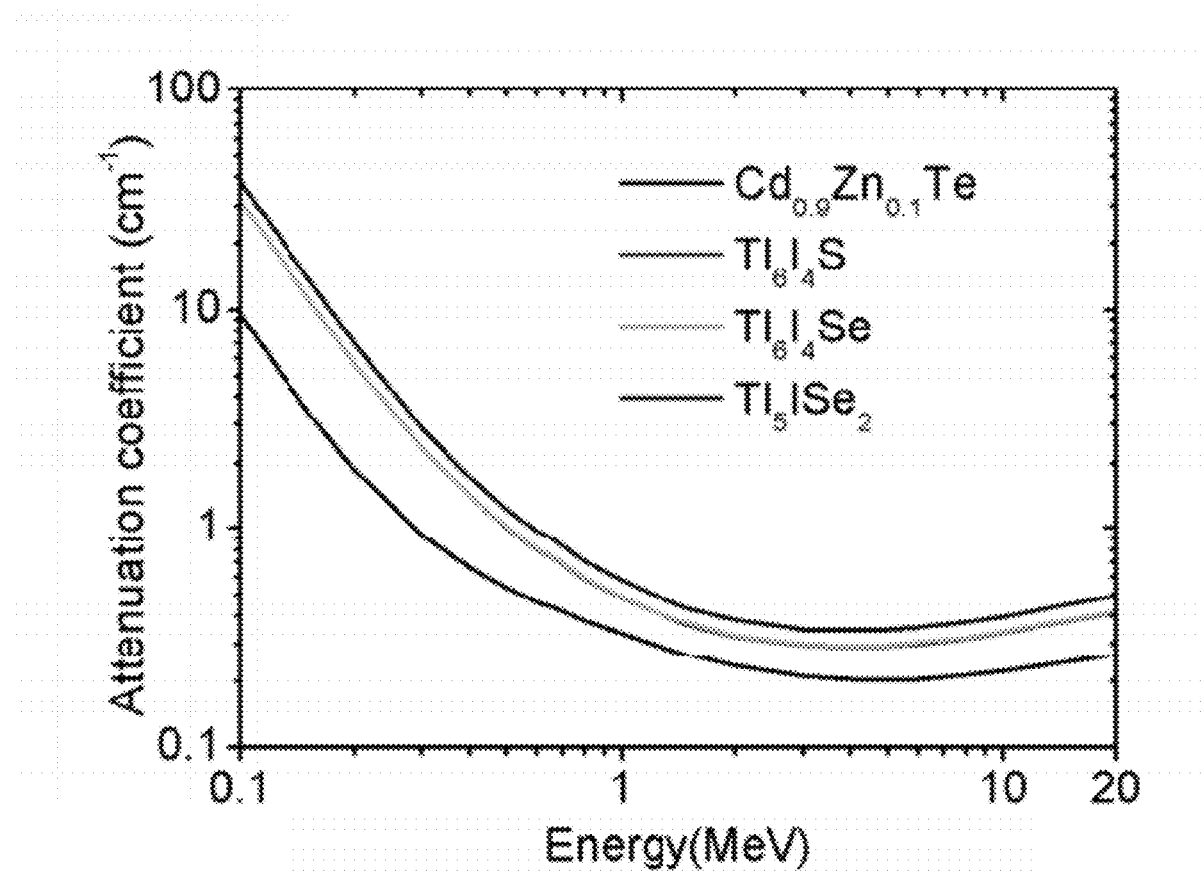
FIG. 25: Calculated attenuation coefficients as a function of the incident photon energy of some of the proposed materials. Calculated CZT attenuation coefficients are added for comparison.

From the attenuation coefficients of the elements, the crystal structure, and the density of the compound, an estimate of the attenuation coefficient for the compound can be made. This is seen in FIG. 25, where the calculated attenuation coefficient of Tl$_6$I$_4$Se is plotted along with that of Cd$_{0.9}$Zn$_{0.1}$Te. In the entire energy range the attenuation of Tl$_6$I$_4$Se is larger or equal to that of Cd$_{0.9}$Zn$_{0.1}$Te. Notably for high energy $\gamma$-rays Tl$_6$I$_4$Se outperforms Cd$_{0.9}$Zn$_{0.1}$Te (note the logarithmic scales).

Because crystals of Tl$_6$I$_4$Se (Tl$_6$I$_4$S) melt congruently at 432° C. they can be grown using the Bridgman technique. TlI and Tl$_2$Se are mixed in a stoichiometric ratio and sealed in an evacuated quartz tube with a tapered end. The tapered end promotes single crystal growth by inducing crystallization from a single grain, FIG. 26. The sample is then slowly lowered through a dual-zone furnace with the upper zone set to 470° C. and the lower at 270° C.

Thallium halides have been considered for x-ray and gamma ray detection purposes. One major problem is the crystals are soft and malleable, making them hard to process without inducing mechanical damage (e.g., TlBr has a Knoop hardness of ~12 kg mm$^{-2}$; equivalent to refrigerated butter). The thallium chalco-halides have the advantage they form much harder compounds, which facilitates mechanical processing.

Wafers were cut from the sample in FIG. 23 both perpendicular and parallel to the growth direction. Laue X-ray diffraction photographs confirmed the single crystal nature of the material. A waferizing saw with a diamond impregnated blade (150 μm thick) was used for cutting. The wafers were subsequently polished using a slurry with 50 nm Al$_2$O$_3$ particles.

Figure 26:
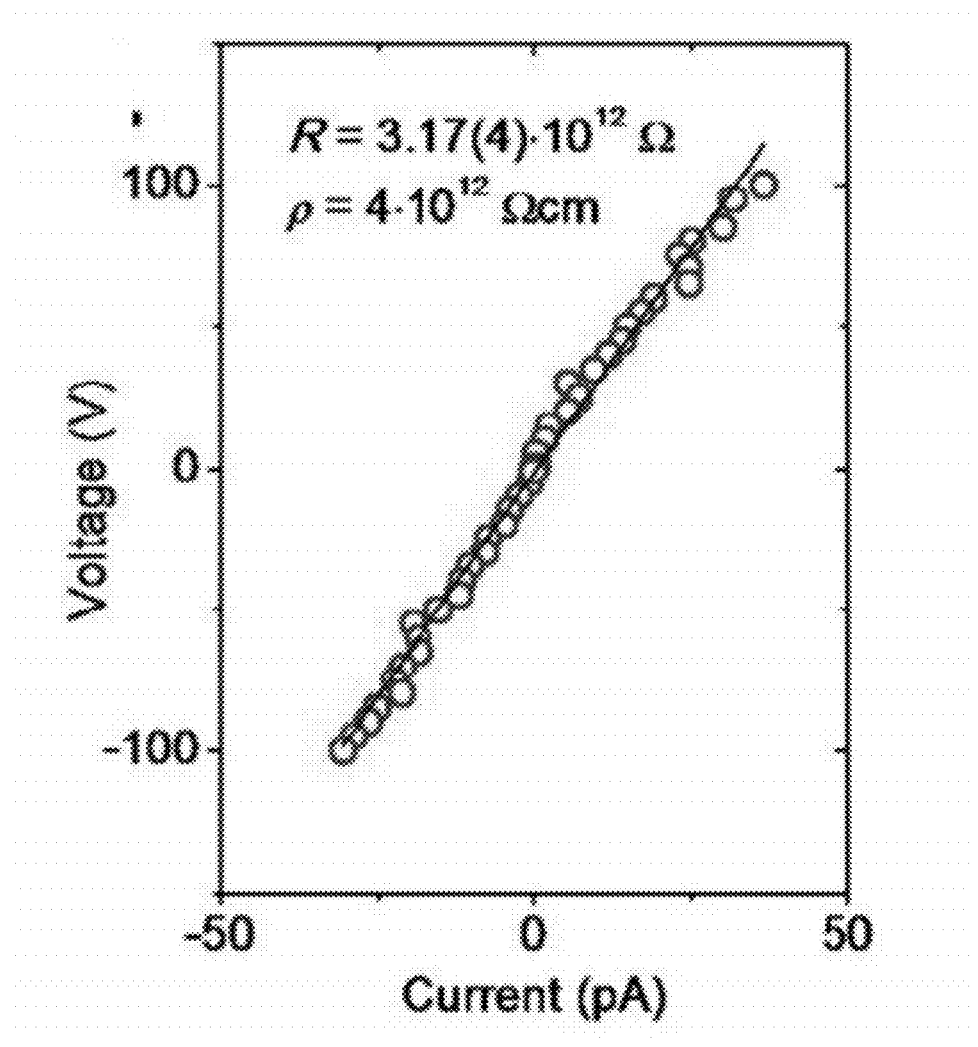
FIG. 26: IV curve for a $Tl_6I_4Se$ wafer.

In FIG. 26 the voltage-current characteristics of the $Tl_6I_4Se$ wafers cut perpendicular to the growth direction are shown. A linear fit to the Ohmic behavior shows a resistivity of $4 \cdot 10^{12}$ Ωcm. This far exceeds the minimum recommended value of $10^9$ Ωcm for the resistivity in a detector grade material.

TABLE 5

Measured physical properties and calculated absorption coefficients of the thallium chalco-halides. Data for CZT is added for comparison.

| Compound | Melting point °C. | Density gcm$^{-3}$ | Band gap eV | Resistivity Ωcm | $\mu_{662\,keV}$ cm$^{-1}$ |
|---|---|---|---|---|---|
| $Cd_{0.9}Zn_{0.1}Te$ | ~1100 | 5.78 | 1.57 | $3 \cdot 10^{10}$ | 0.439 |
| $Tl_2TeCl_6$ | — | 4.82 | — | >10$^6$ | 0.458 |
| $Tl_2TeBr_6$ | — | 5.66 | ~1.9 | >10$^6$ | 0.500 |
| $Tl_2TeI_6$ | — | 5.97 | — | >10$^6$ | 0.529 |
| $Tl_5Se_2Cl$ | — | 8.63 | — | >10$^6$ | 0.908 |
| $Tl_5Se_2Br$ | — | 8.86 | — | >10$^6$ | 0.921 |
| $Tl_5Se_2I$ | 447 | 8.59 | — | >10$^6$ | 0.889 |
| $Tl_6Cl_4S$ | — | 7.13 | ~2.1 | >10$^6$ | 0.765 |
| $Tl_6Br_4S$ | — | 7.38 | ~2.1 | >10$^6$ | 0.760 |
| $Tl_6I_4S$ | 437 | 7.25 | 1.91 | >10$^6$ | 0.736 |
| $Tl_6I_4Se$ | 432 | 7.38 | 1.86 | $4 \cdot 10^{12}$ | 0.742 |

Measurements show good gamma-ray response for this unoptimized $Tl_6I_4Se$ compound.

Example 10

Figure 27:
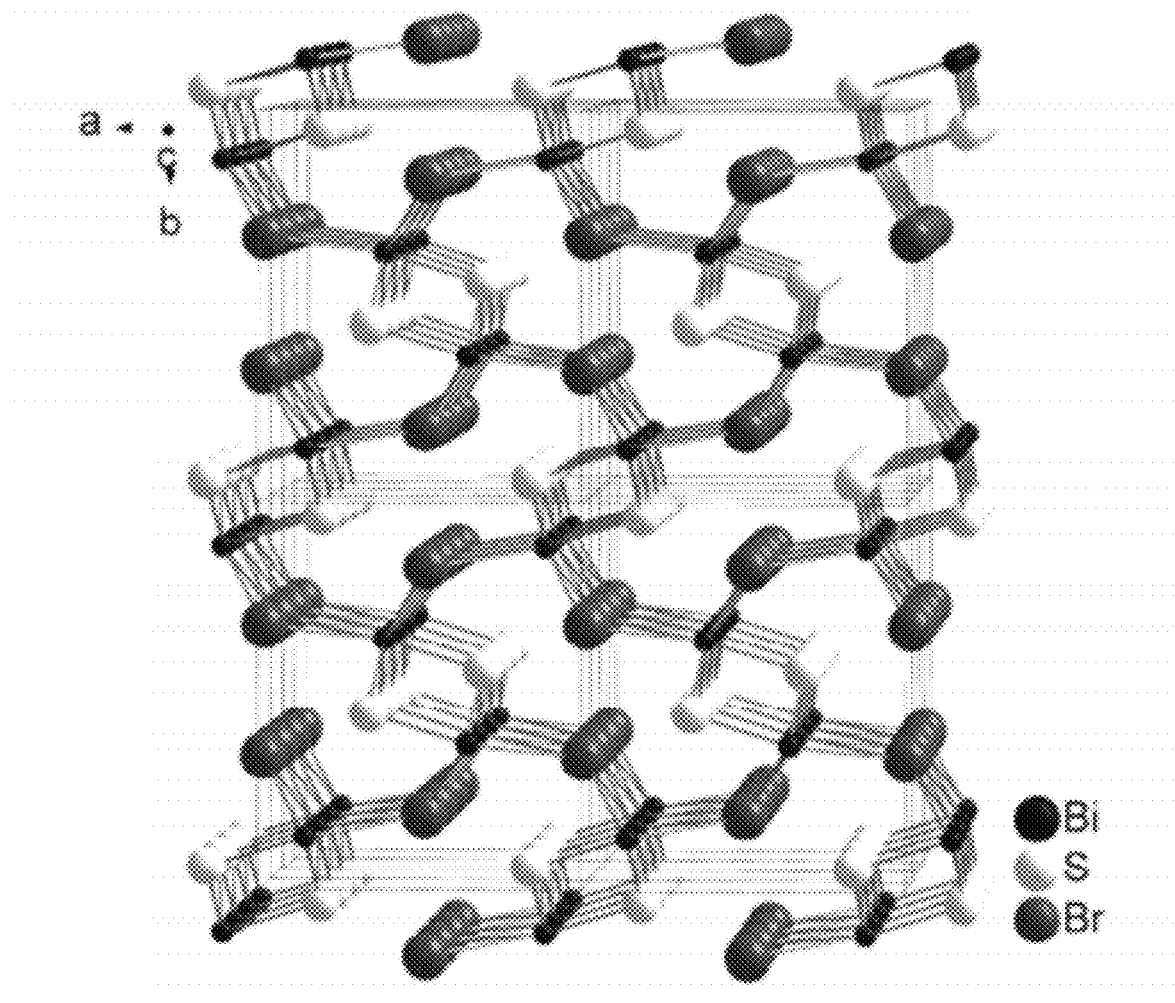
FIG. 27: A. Crystal structure of BiSBr, which shows the infinite chains of $[BiSBr]_\infty$. The chains are connected by long Bi—Br bonds.

$(Pn_2Q_3)_m(PnX_3)_n$ with Pn=N, P, As, Sb or Bi; Q=S, Se, or Te; and X=F, Cl, Br or I Bismuth is the highest atomic number element that is non-radioactive, and consequently any wide band gap semiconductors comprising bismuth are potentially good candidates for radiation detectors. These include the chalco-halides BiSBr (FIG. 27), BiSI, and BiSeBr as X-ray and gamma-ray radiation detection materials. The compounds have a density of over 6.8 g/cm$^3$ and band gaps of 1.95, 1.56, 1.50 eV respectively. Other examples include $Bi_7S_{10}Cl$ and $Bi_7S_{10}Br$ (P. F. Poudeu, and M. Ruck, J. Solid State Chem. 179, 3636 (2006)).

The crystal morphology of these Bi compounds is quite favorable for crystal growth. Since BiSBr melts congruently, the compound can be grown as large crystals using the Bridgman method. This is typically done in a dual-zone furnace with a top zone temperature 30-40° C. above the melting point of BiSBr (535° C.) and a lower zone temperature 200° C. below the top zone temperature. The materials can be sealed in quartz ampoules under vacuum or under argon gas and slowly lowered through the furnace at <1 mm/h. This is not the only method of synthesis applicable to this system. Since the compound has a significant vapor pressure close to its melting point it is also possible to synthesize the material using flux and even vapor transport. This crystal growth can also be done for SbSI and BiSI. It is also possible to grow crystals in a flux of excess $BiX_3$ (X=Cl, Br, or I) Similar approaches can be employed to grow crystal and films for the BiSI, BiSeBr analogs. Thin films of the above materials can also be applied in X-ray and gamma-ray detection applications.

Example 11

$RbPbF_3$ and $CsPbF_3$ (Y. Yamane, K. Yamada, and K. Inoue, Solid State Ionics 179, 605 (2008))

These two compounds (Table 6) were grown from a melt in a high-frequency crystallization installation in an Ar—HF mixture atmosphere. The binary compounds MF and $PbF_2$ were used as the starting materials for the single crystal growth of $MPbF_3$.

TABLE 6

Experimental and calculated properties for $MPbF_3$ (M = Rb or Cs) compounds.

| Material | Z | Density g/cm$^3$ | LDA band gap (eV) (M. Klintenberg, S. E. Derenzo, and M. J. Weber, Nucl Instrum Meth A 486, 298 (2002)) | Conductivity | $\mu_{662\,keV}$ (cm$^{-1}$) |
|---|---|---|---|---|---|
| $RbPbF_3$ | 37, 82, 9 | 5.28 | 1.91 (SX-LDA = 2.51) | Not measured | 0.511 |
| $CsPbF_3$ | 55, 82, 9 | 5.96 | 1.78 | Not measured | 0.574 |

As used herein, and unless otherwise specified, "a" or "an" means "one or more." As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method for detecting incident radiation, the method comprising:
    exposing a material comprising an inorganic compound comprising at least three elements to incident radiation, wherein the material absorbs incident radiation and electron-hole pairs are generated in the material; and
    measuring at least one of the energy or intensity of the absorbed incident radiation by detecting the generated electrons and/or holes;
    wherein at least one of the three elements is an element from period five or period six of the Periodic Table of the Elements and another of the three elements is selected from S, Se, Te, Cl, F, I and Br,
    wherein the material does not comprise CdZnTe and further wherein the incident radiation is x-ray or gamma radiation.

2. The method of claim 1, wherein the inorganic compound has a bandgap of at least 1.5 eV and an electrical resistivity of at least $10^6$ Ωcm.

3. The method of claim 1, wherein the first of the three elements is from period five or period six of the Periodic Table of the Elements, the second of the three elements is from period four, period five or period six of the Periodic Table of the Elements, and the third of the three elements is selected from S, Se, Te, Cl, F, I and Br.

4. The method of claim 3, wherein at least one of the first or the second elements is from period six of the Periodic Table of the Elements.

5. The method of claim 4, wherein both the first and the second elements are from period six of the Periodic Table of the Elements.

6. The method of claim 4, wherein the first element is from period five of the Periodic Table of the Elements and the second element is from period six of the Periodic Table of the Elements.

7. The method of claim 3, wherein the third element is S, Se or Te.

8. The method of claim 3, wherein the third element is Cl, F, I or Br.

9. The method of claim 1, wherein the inorganic compound comprises a chalco-halide compound.

10. The method of claim 1, wherein the inorganic compound has an anionic extended framework with cationic counterions.

11. The method of claim 10, wherein the inorganic compound comprises a compound having the formula: $AB_2Q_4$, where A=Cd, Hg or Pb; B=Al, Ga, or In; and Q=S, Se, or Te.

12. The method of claim 10, wherein the inorganic compound comprises a compound having the formula: $TlBQ_2$, where B=Al, Ga, or In; and Q=S, Se, or Te.

13. The method of claim 10, wherein the inorganic compound comprises a compound having the formula: $(A_2Q)_m(AX)_n$, where A=Na, K, Rb, Cs or Tl; Q=S, Se, or Te; and X=F, Cl, Br or I.

14. The method of claim 10, wherein the inorganic compound comprises a compound having the formula: $(AX)_m(BX_2)_n$, where A=Na, K, Rb, Cs or Tl; B=Cu, Zn, Cd, or Hg; and X=F, Cl, Br or I.

15. The method of claim 10, wherein the inorganic compound comprises a compound having the formula: $(Pn_2Q_3)_m(PnX_3)_n$, where Pn=N, P, As, Sb or Bi; Q=S, Se, or Te; and X=F, Cl, Br or I.

16. The method of claim 10, wherein the inorganic compound comprises a compound having the formula: $(A_2Q)_m(Au_2Q)_n$, where A=Na, K, Rb, Cs or Tl; and Q=S, Se, or Te.

17. The method of claim 10, wherein the inorganic compound comprises a compound having the formula: $(A_2Q)_m(BQ)_n$, where A=Na, K, Rb, Cs or Tl; B=Cd or Hg; and Q=S, Se or Te.

18. The method of claim 10, wherein the inorganic compound comprises a compound having the formula: $(A_2Q)_m(Pn_2Q_3)_n$, where A=Na, K, Rb, Cs or Tl; Pn=P, As, Sb, or Bi; and Q=S, Se, or Te.

19. The method of claim 1, wherein the inorganic compound has a cationic extended framework with anionic counterions.

20. The method of claim 1, wherein the incident radiation is x-ray radiation.

21. The method of claim 1, wherein the incident radiation is gamma radiation.

22. The method of claim 1, wherein the inorganic compound is selected from the group consisting of $Cs_2Hg_3Se_4$, $Cs_2Hg_6S_7$, $Tl_2Hg_3S_4$, $Tl_2Hg_3Se_4$ and $Tl_2Hg_3Te_4$.

23. The method of claim 1, wherein the inorganic compound is selected from the group consisting of $Tl_2TeCl_6$, $Tl_2TeBr_6$, $Tl_2TeI_6$, $Tl_5Se_2Cl$, $Tl_5Se_2Br$, $Tl_5Se_2I$, $Tl_6Br_4S$ and $Tl_6I_4Se$.

24. The method of claim 23, wherein the inorganic compound is $Tl_6I_4Se$.

25. The method of claim 1, wherein the inorganic compound is selected from the group consisting of $[HgTe_2][HfCl_6]$, $[Hg_4As_2][HfCl_6]$, $[Hg_2As]_2[CdI_4]$ and $Hg_4P_2I_3$.

26. A device for the detection of incident radiation comprising:
  a material comprising an inorganic compound comprising at least three elements, wherein at least one of the three elements is an element from period five or period six of the Periodic Table of the Elements and another of the three elements is selected from S, Se, Te, Cl, F, I and Br, and further wherein the material is capable of absorbing incident radiation and generating electron-hole pairs;
  a first electrode in electrical communication with the material;
  a second electrode in electrical communication with the material, wherein the first and second electrodes are configured to apply an electric field across the material and to collect the generated electrons and/or holes; and
  a detector configured to measure a signal generated by the collected electrons and/or holes upon exposure to the incident radiation,
  wherein the material does not comprise CdZnTe and further wherein the incident radiation is x-ray or gamma radiation.

* * * * *